(12) United States Patent
Mizushima

(10) Patent No.: US 9,648,741 B2
(45) Date of Patent: May 9, 2017

(54) ELECTRONIC DEVICE AND METHOD FOR MANUFACTURING ELECTRONIC DEVICE

(71) Applicant: FUJITSU LIMITED, Kawasaki-shi, Kanagawa (JP)

(72) Inventor: Yoriko Mizushima, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/940,520

(22) Filed: Nov. 13, 2015

(65) Prior Publication Data

US 2016/0174375 A1    Jun. 16, 2016

(30) Foreign Application Priority Data

Dec. 15, 2014   (JP) ................. 2014-253137

(51) Int. Cl.
*H01L 21/768* (2006.01)
*H01L 23/52* (2006.01)
*H05K 1/11* (2006.01)
*H05K 3/40* (2006.01)
*H05K 1/02* (2006.01)

(52) U.S. Cl.
CPC ........... *H05K 1/115* (2013.01); *H05K 1/0271* (2013.01); *H05K 3/4038* (2013.01); *H05K 2201/068* (2013.01); *H05K 2201/09845* (2013.01)

(58) Field of Classification Search
CPC . H01L 2224/13078; H01L 2224/13191; H01L 2224/13578; H01L 2224/29191; H05K 1/115; H05K 2201/068; H05K 2201/09845; H05K 2201/09872
See application file for complete search history.

(56) References Cited

U.S. PATENT DOCUMENTS

| 8,623,762 | B2 * | 1/2014 | Kraft ................. H01L 21/76898 257/E21.597 |
| 2005/0121768 | A1 * | 6/2005 | Edelstein .............. H01L 21/486 257/698 |
| 2006/0290002 | A1 | 12/2006 | Arana |
| 2010/0207266 | A1 * | 8/2010 | Chang ................... H01L 21/563 257/692 |
| 2010/0244201 | A1 | 9/2010 | Kitada |

FOREIGN PATENT DOCUMENTS

| JP | 2008-545251 A1 | 12/2008 |
| JP | 2010-226060 A1 | 10/2010 |
| JP | 2012-190826 A1 | 10/2012 |
| JP | 2013-38165 A1 | 2/2013 |

* cited by examiner

*Primary Examiner* — Raj R Gupta
(74) *Attorney, Agent, or Firm* — Kratz, Quintos & Hanson, LLP

(57) ABSTRACT

An electronic device includes; a first substrate; a second substrate Located facing the first substrate; a resin layer formed between the first substrate and the second substrate and having a first thermal expansion coefficient; a conductor via penetrating the first substrate and the resin layer; a barrier film covering a side surface of the conductor via; a first film formed between the resin layer and the barrier film and having viscoelasticity; and a second film formed between the first film and the barrier film and having a second thermal expansion coefficient lower than the first thermal expansion coefficient.

11 Claims, 23 Drawing Sheets

ELECTRONIC DEVICE AND METHOD FOR MANUFACTURING ELECTRONIC DEVICE

CROSS-REFERENCE TO RELATED APPLICATION

This application is based upon and claims the benefit of priority of the prior Japanese Patent Application No. 2014-253137, filed on Dec. 15, 2014, the entire contents of which are incorporated herein by reference.

FIELD

The embodiments discussed herein are related to an electronic device and a method for manufacturing an electronic device.

BACKGROUND

As one aspect of electronic devices, a three-dimensional stacked device in which substrates, such as a semiconductor chip and a semiconductor wafer, are stacked is known.

As a method for manufacturing the three-dimensional stacked device, there is a method including forming a hole penetrating one substrate of upper and lower substrates bonded to each other through a resin layer and the resin layer using a through silicon via (TSV) technique, and then forming a conductor via, the side surface of which is covered with a barrier film, in the hole.

In the manufacturing of the three-dimensional stacked device, a process including heating is carried out. After the process including heating, a residual stress may be generated around the conductor via in the resin layer due to thermal expansion coefficient differences among the materials of the substrates, the conductor via, and the resin layer. The residual stress has a possibility of causing peeling between the materials. As a technique of avoiding the generation of the residual stress, a technique of providing a post (insulating film and the like) having a predetermined thermal expansion coefficient in such a manner as to surround the conductor via in the resin layer has been proposed.

However, also in the three-dimensional stacked device disposed with the above-described post, when the number of times of heating processes in the manufacturing thereof and the like increases, so that the expansion and the contraction of the contained materials are repeated, there is a possibility that a gap may be formed in a region between the resin layer and the conductor via in the resin layer due to the thermal expansion coefficient differences among the materials. Such a gap may cause a reduction in the barrier property of the barrier film covering the side surface of the conductor via and a reduction in the characteristics and the reliability of the three-dimensional stacked device due to the reduction in the barrier property.

The following is a reference document:
[Document 1] Japanese Laid-open Patent Publication No. 2010-226060.

SUMMARY

According to an aspect of the invention, an electronic device includes; a first substrate; a second substrate Located facing the first substrate; a resin layer formed between the first substrate and the second substrate and having a first thermal expansion coefficient; a conductor via penetrating the first substrate and the resin layer; a barrier film covering a side surface of the conductor via; a first film formed between the resin layer and the barrier film and having viscoelasticity; and a second film formed between the first film and the barrier film and having a second thermal expansion coefficient lower than the first thermal expansion coefficient.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First, a three-dimensional stacked device which is one aspect of an electronic device is described.

In recent years, the integration of semiconductor chips has shifted from a two-dimensional layout structure which improves the in-plane integration degree to a three-dimensional structure in which a plurality of semiconductor chips are vertically stacked. For example, with respect to semiconductor chips for use in portable communication terminals, a system-in-package type has become mainstream, and the range of use of a three dimensional technique has tended to further expand, for example, a flash memory in which semiconductor chips are stacked and the like has been released.

There are some techniques of stacking semiconductor chips to form a three-dimensional structure, which include a technique of stacking semiconductor chips obtained after dicing of a wafer, a technique of stacking wafers on which semiconductor chips are formed before dicing, and then performing dicing, and the like. In any three-dimensional stacking technique, the electrical connection of upper and lower substrates, such as a semiconductor chip and a wafer, is performed with a conductor via formed using a TSV technique.

Figure 1A:
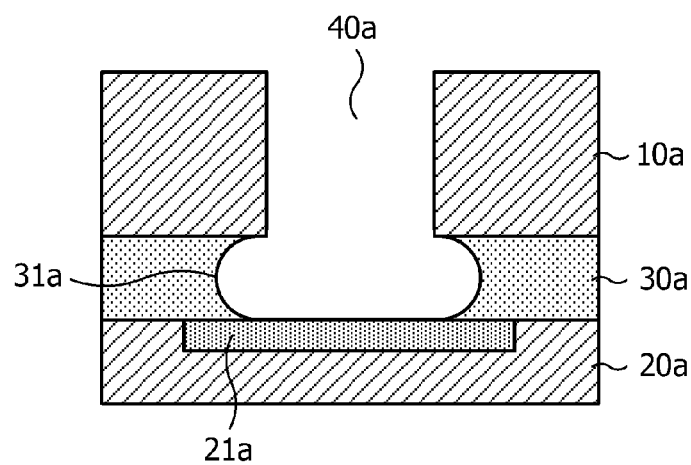
FIGS. 1A to 1C are views illustrating a first example of a method for forming an electronic device.
Figure 1B:
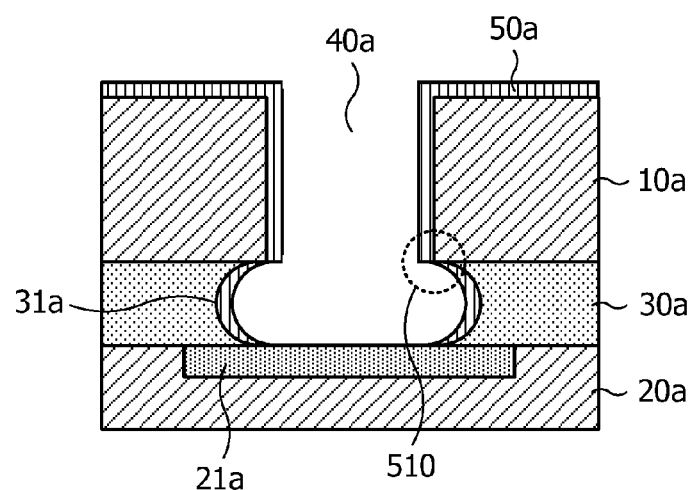
Figure 1C:
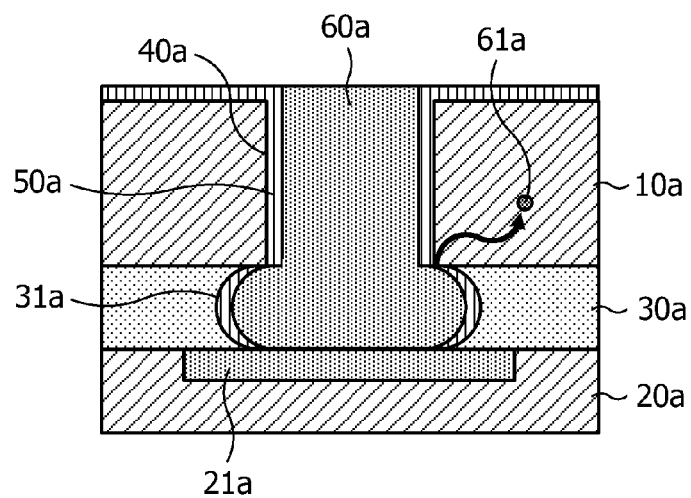

Herein, a first example of a method for forming an electronic device is illustrated in FIGS. 1A to 1C as an example. FIGS. 1A to 1C schematically illustrate a cross-sectional view of a principal portion of each process according to the first example of a method for forming a three-dimensional stacked device.

According to this method, first, an upper substrate 10a and a lower substrate 20a on which a predetermined circuit containing elements, such as a transistor and wiring, is formed are prepared as illustrated in FIG. 1A, and then the substrate 10a and the substrate 20a are joined to each other through a resin layer 30a, such as a permanent adhesive containing an organic material, for bonding. Furthermore, a hole 40a which penetrates the upper substrate 10a and the resin layer 30a to reach a conductor portion 21a disposed in the lower substrate 20a as illustrated in FIG. 1A is formed using a photolithography technique and an etching technique. In the etching, the etching of the resin layer 30a relatively easily proceeds due to a difference in the etching characteristic (the anisotropy degree of etching and the like) of semiconductor materials, such as silicon (Si), to be used for the substrate 10a and the organic material to be used for the resin layer 30a. Therefore, side etching in which the resin layer 30a enters below the substrate 10a, that is, a so-called undercut 31a, is likely to be formed in the resin layer 30a.

After the formation of the hole 40a containing such an undercut 31a, an insulating barrier film 50a containing silicon oxide (SiO), silicon nitride (SiN), or the like covering the inner wall of the hole 40a is formed as illustrated in FIG. 1B. For the formation of the barrier film 50a, film forming techniques, such as a chemical vapor deposition (CVD) method, may be used. In the formation process of the barrier film 50a, which includes heating, the resin layer 30a softens during the heating, and then the resin layer 30a is cured and contracts during cooling after the heating depending on the materials used for the resin layer 30a, so that the undercut 31a somewhat expands in some cases.

Then, as illustrated in FIG. 1C, the hole 40a on which the barrier film 50a is formed is filled with a conductive material, such as copper (Cu) to form a conductor via 60a. For the formation of the conductor via 60a, a plating method and the like may be used. Using the conductor via 60a thus formed, the upper substrate 10a and the lower substrate 20a are electrically connected to each other.

In such a method, when the undercut 31a described above is formed in the formation process of the hole 40a illustrated in FIG. 1A, the covering property of the barrier film 50a may decrease when the inner wall of the hole 40a is covered with the barrier film 50a in a subsequent process of FIG. 1B. For example, the covering property of the barrier film 50a near a lower opening end portion of the substrate 10a, such as a portion 510 of FIG. 1B, decreases.

When the covering properly of the barrier film 50a decreases, there is a possibility that a component 61a, such as Cu, contained in the conductor via 60a formed in the hole 40a may diffuse into the substrate 10a as illustrated in FIG. 1C, for example. Such diffusion of the component 61a of the conductor via 60a may cause a reduction in the characteristics and the reliability of a three-dimensional stacked device, such as a short circuit of the circuit included in the substrate 10a, deterioration of the characteristics of elements, such as a transistor, and an increase in the resistance of the conductor via 60a.

Figure 2A:
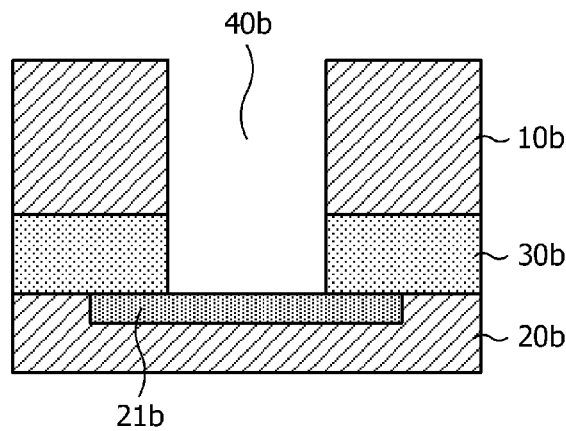
FIGS. 2A to 2C are views illustrating a second example of a method for forming an electronic device.
Figure 2B:
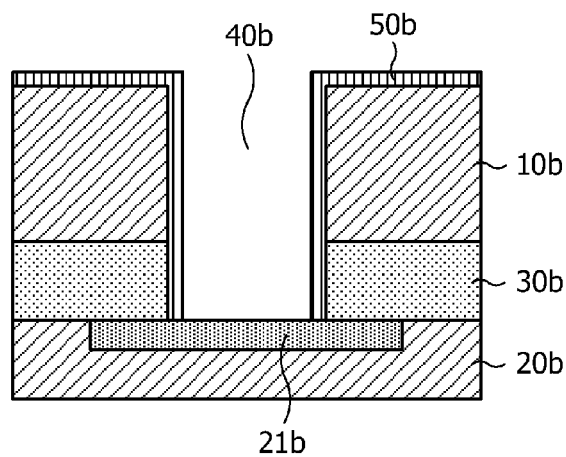
Figure 2C:
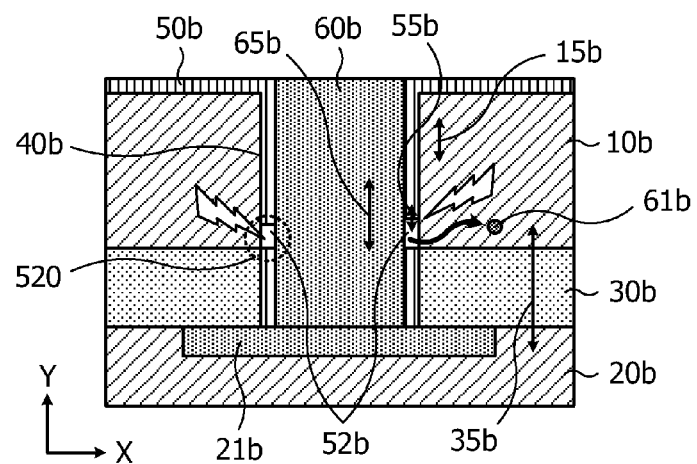

On the other hand, suppression of the above-described undercut has also been attempted by improving the etching technique. Herein, a second example of a method for forming an electronic device is illustrated in FIGS. 2A to 2C. FIGS. 2A to 2C schematically illustrate cross-sectional views of a principal portion of each process according to the second example of a method for forming a three-dimensional stacked device.

According to this method, first, an upper substrate 10b and a lower substrate 20b on which a predetermined circuit containing elements, such as a transistor and wiring, is formed are prepared as illustrated in FIG. 2A, and then the substrate 10b and the substrate 20b are joined to each other through a resin layer 30b containing an organic material, for bonding. Then, etching is performed under the conditions where the formation of an undercut of the resin layer 30b is suppressed to form a hole 40b which penetrates the upper substrate 10b and the resin layer 30b to reach a conductor portion 21b disposed in the lower substrate 20b as illustrated in FIG. 2A.

After the formation of the hole 40b, a barrier film 50b containing SiO or the like covering the inner wall of the hole 40b is formed as illustrated in FIG. 2B. In the formation process of the barrier film 50b, which includes heating, the resin layer 30b softens during the heating depending on the materials used for the resin layer 30b, and then the resin layer 30b is cured and contracts during cooling after the heating, so that the hole 40b somewhat expands in the resin layer 30b portion in some cases.

Then, as illustrated in FIG. 2C, the hole 40b on which the barrier film 50b is formed is filled with a conductive material such as Cu to form a conductor via 60b.

Thus, the conductor via 60b may also be formed after suppressing the generation of an undercut of the resin layer 30b. By suppressing the undercut of the resin layer 30b in the process of FIG. 2A, a reduction in the covering property of the barrier film 50b to be formed in a subsequent process of FIG. 2B may be suppressed. However, also when such a method is used, the following problems may arise.

More specifically, materials different from each other in the thermal expansion coefficient may be used for the substrate 10b, the resin layer 30b, the barrier film 50b, and the conductor via 60b contained in the three-dimensional stacked device. For example, materials are used for the barrier film 50b, the substrate 10b, the conductor via 60b, and the resin layer 30b in such a manner that the thermal expansion coefficient increases in this order. FIG. 2C illustrates the size (amount of change in thermal expansion in a substrate stacking direction Y) of the thermal expansion coefficient of each of the barrier film 50b, the substrate 10b, the conductor via 60b, and the resin layer 30b by the lengths of an arrow 55b, a narrow 15b, an arrow 65b, and an arrow 35b, respectively.

In the formation process of the three-dimensional stacked device, a process including heating is carried out even after the process of FIG. 2C. Examples of such processes include an annealing process to be performed after filling the inside of the hole 40b with Cu and the like using a plating method, a process of forming a cap film and a re-wiring layer on the substrate 10b after the formation of the conductor via 60b, and a process of joining another substrate onto the substrate 10b. In such processes including heating, a relatively high stress occurs in a portion where materials with high thermal expansion coefficient differences are concentrated in a narrow region as in a portion 520 of FIG. 2C due to the thermal expansion coefficient differences among the materials. After such processes including heating, a stress remaining in the portion 520 of FIG. 2C may become relatively high. When the residual stress becomes relatively high as described above, cracks 52b are likely to be formed in a relatively thin barrier film 50b present in the relatively high stress portion. When such cracks 52b are formed, a component 61b, such as Cu, of the conductor via 60b is diffused into the substrate 10b from the cracks 52b, which may cause a reduction in the characteristics and the reliability of the three-dimensional stacked device reduction, such as a short circuit of the circuit.

Figure 3A:
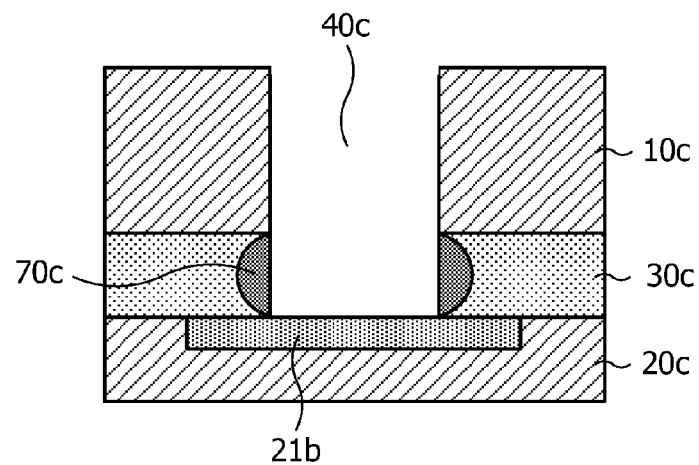
FIGS. 3A to 3C are views illustrating a third example of a method for forming an electronic device.
Figure 3B:
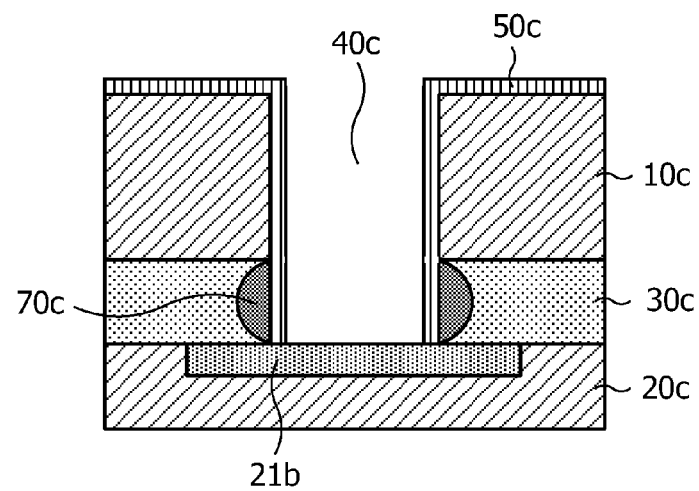
Figure 3C:
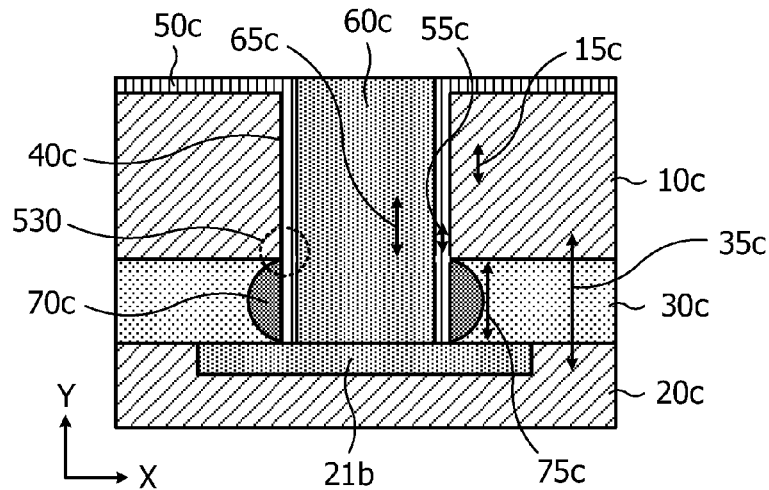

In order to address such problems, a measure illustrated in the following views, FIGS. 3A to 3C, may also be employed. FIGS. 3A to 3C are views illustrating a third example of a method for forming an electronic device. FIGS. 3A to 3C schematically illustrate cross-sectional views of a principal portion of each process according to the third example of the method for forming a three-dimensional stacked device.

According to this method, a film 70c containing a predetermined material is disposed in a hole 40c to be formed using an etching technique in an upper substrate 10c and a resin layer 30c of the upper substrate 10c and a lower substrate 20c bonded to each other through a resin layer 30c containing an organic material as illustrated in FIG. 3A. For the substrate 10c and the substrate 20c, those on which a predetermined circuit containing elements, such as a transistor and wiring, is formed are used. For the film 70c, a material having a thermal expansion coefficient set based on the thermal expansion coefficients of a conductor via 60c (FIG. 3C) formed in the hole 40c as described later and the resin layer 30c around the conductor via 60c is used. For example, for the film 70c, a material having a thermal expansion coefficient close to the thermal expansion coefficient of the conductor via 60c or a material having a thermal expansion coefficient between the thermal expansion coefficients of the conductor via 60c and the resin layer 30c is used.

In the hole 40c in which such a film 70c is disposed, a barrier film 50c containing SiO or the like covering the inner wall of the hole 40c is formed using a CVD method and the like as illustrated in FIG. 3B. In the formation process of the barrier film 50c, which includes heating, the resin layer 30c softens during the heating, and then the resin layer 30c is cured and contracts during cooling after the heating depending on the material used for the resin layer 30b, so that the hole 40c somewhat expands in the film 70c portion in the resin layer 30c in some cases. According to this method, due to the fact that the film 70c is disposed in the hole 40c, the generation of a large undercut is suppressed, so that the barrier film 50c may be formed with better covering property as compared with the process illustrated in FIG. 1B above.

Then, after the formation of the barrier film 50c, the hole 40c, on the inner wall of which the barrier film 50c is formed, is filled with a conductive material, such as Cu, using a plating method and the like to form the conductor via 60c as illustrated in FIG. 3C.

According to this method, the generation of a large undercut is suppressed by providing the film 70c in the hole 40c as described above, and the barrier film 50c may be formed with a relatively good covering property in the process of FIG. 3B. Furthermore, according to this method, by providing the film 70c having a predetermined thermal expansion coefficient, the amount of the resin layer 30c with a relatively high thermal expansion coefficient which is present around the conductor via 60c may be reduced and the stress remaining on the portion 530 of FIG. 3C after the process including heating may be reduced. Examples of the processes including heating include an annealing process to be performed after filling the inside of the hole 40c with Cu and the like using a plating method, a process of forming a cap film and a re-wiring layer on the substrate 10c after the formation of the conductor via 60c, a process of further joining another substrate onto the substrate 10c, and the like. FIG. 3C illustrates the size (amount of change in the thermal expansion in the substrate stacking direction Y) of the thermal expansion coefficient of each of the barrier film 50c, the substrate 10c, the conductor via 60c, the resin layer 30c, and the film 70c by the lengths of an arrow 55c, an arrow 15c, an arrow 65c, an arrow 35c, and an arrow 75c, respectively.

Using the method illustrated in FIGS. 3A to 3C, the formation of a crack in a portion 530 of FIG. 3C and a reduction in the characteristics and the reliability of the three-dimensional stacked device due to the crack are suppressed. However, in the manufacturing of the three-dimensional stacked device, the process including heating may be carried out two or more times. When the process including heating is carried out two or more times, that is, the total number of times heating is performed is increased, the following problems may arise due to repeated expansion and contraction of materials contained in the three-dimensional stacked device and materials near the conductor via.

Figure 4A:
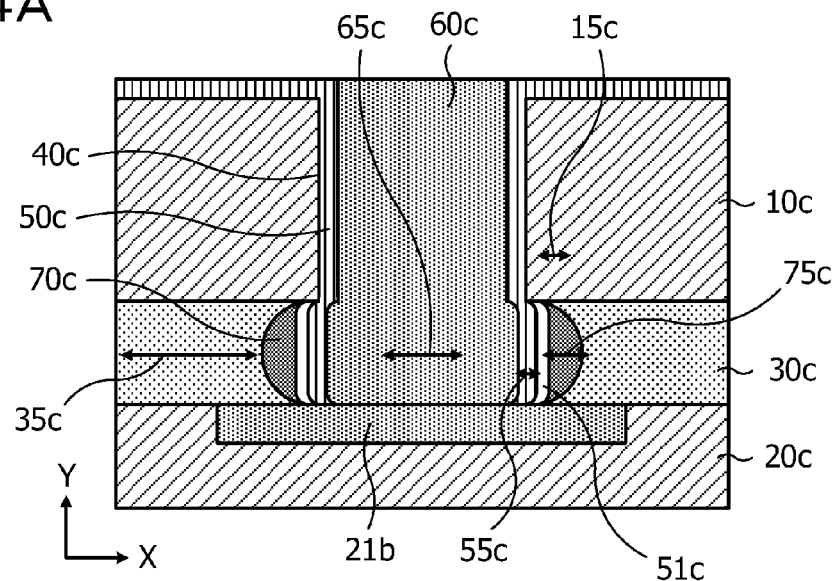
FIGS. 4A and 4B are explanatory views of problems which may arise in an electronic device.
Figure 4B:
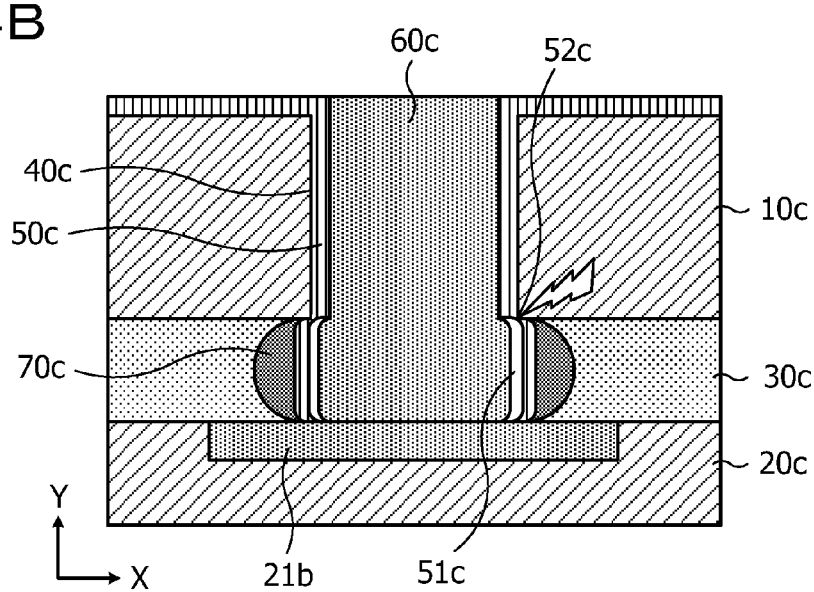

FIGS. 4A and 4B are explanatory views of problems which may arise in an electronic device. FIGS. 4A and 4B schematically illustrate cross-sectional views of a principal portion of the three-dimensional stacked device including the problems.

According to the method including providing the film 70c having a predetermined thermal expansion coefficient described with reference to FIGS. 3A to 3C above, the formation of a crack which causes a reduction in the characteristics and the reliability of the three-dimensional stacked device may be suppressed until the formation process of the conductor via 60c of FIG. 3C.

However, in the manufacturing of the three-dimensional stacked device, the process including heating, for example, the process of forming a cap film and a re-wiring layer on the substrate 10c, the process of further joining another substrate (substrate on which a predetermined circuit is formed) onto the substrate 10c, and the like, may be carried out even after the process of FIG. 3C. In the heating, the resin layer 30c containing an organic material may cause the expansion in a substrate plane direction X. When an organic material with a low glass transition point is used for the resin layer 30c, the resin layer 30c may be softened in the heating, and then may cause contraction in the substrate plane direction X with curing (curing and contraction) in cooling.

Herein, materials are used for the barrier film 50c, the conductor via 60c, and the resin layer 30c in such a manner that the thermal expansion coefficient becomes higher in this order. For the film 70c disposed between the barrier film 50c and the resin layer 30c, a material having a thermal expansion coefficient close to the thermal expansion coefficient of the conductor via 60c or a material having a thermal expansion coefficient between the thermal expansion coefficients of the conductor via 60c and the resin layer 30c is used. FIG. 4A illustrates one example of the size (amount of change in the thermal expansion in the substrate plane direction X) of the thermal expansion coefficient of each of the barrier film 50c, the substrate 10c, the conductor via 60c, the resin layer 30c, and the film 70c by the lengths of the arrow 55c, the arrow 15c, the arrow 65c, the arrow 35c, and the arrow 75c, respectively.

It is supposed that the organic material described above is used for the resin layer 30c and the heating process including heating and subsequent cooling is repeated for such a structure. Then, a gap 51c and a crack 52c as illustrated in FIG. 4A and FIG. 4B may be formed in a portion between the upper substrate 10c and the lower substrate 20c due to thermal expansion coefficient differences among the materials present in the portion.

More specifically, in the heating, the barrier film 50c and the film 70c present between the conductor via 60c and the resin layer 30c which causes curing and contraction after expansion and softening may be pressed so as to expand outward with the expansion of the conductor via 60c. In the subsequent cooling, the resin layer 30c and the film 70c which were expanded in the heating or are to be cured and contracted in the cooling or such a resin layer 30c, such a film 70c, and the barrier film 50c do not follow the contraction of the conductor via 60c. Such a phenomenon occurring due to the thermal expansion coefficient differences among different materials may repeatedly occur during a plurality of heating processes including heating and subsequent cooling. In this case, a mismatch of the expansion amount and the contraction amount among the conductor via 60c, the barrier film 50c, the film 70c, and the resin layer 30c may occur.

Due to the fact that such a mismatch of the expansion amount and the contraction amount among the different materials occurs, the gap 51c may be formed between the barrier film 50c and the film 70c as illustrated in FIG. 4A and the gap 51c may be formed between the conductor via 60c and the barrier film 50c as illustrated in FIG. 4B. Moreover, an excessive stress may be applied to the barrier film 50c with the expansion in the heating processes and the contraction in the cooling process described above, the crack 52c may be formed in the barrier film 50c as illustrated in FIG. 4B, for example.

Such a gap 51c and a crack 52c may cause a reduction in the characteristics and the reliability of the three-dimensional stacked device, such as a reduction in the barrier property of the barrier film 50c, a short circuit of the circuit due to the reduction in the barrier property, deterioration of the characteristics of elements, such as a transistor, and an increase in the resistance of the conductor via 60c.

Thus, also when the film 70c having a predetermined thermal expansion coefficient is disposed, the formation of the gap 51c between different materials and the formation of the crack 52c in the barrier film 50c may occur when the number of times of the heating processes increases. In particular, in the three-dimensional stacking process, the number of times of heating processes becomes larger and the influence of heat becomes more significant in lower substrates with an increase in the number of layers stacked, unlike the manufacturing of a two-dimensional device, so that the likelihood of the gaps 51c and the crack 52c forming increases.

As described above, a material having a thermal expansion coefficient comparable to that of the conductor via 60c or a thermal expansion coefficient between the thermal expansion coefficients of the conductor via 60c and the resin layer 30c is used for the film 70c, and the film 70c is disposed around the conductor via 60c. The film 70c exhibits a fixed effect of reducing the residual stress of the barrier film 50c mainly in the substrate stacking direction Y. However, the film 70c may not be able to follow the changes in the substrate plane direction X in the situation where the number of times of the heating processes increases and the volume change is repeated. Only by providing the film 70c whose thermal expansion coefficient is specified to a predetermined value around the conductor via 60c, the formation of the gap 51c and the crack 52c in the barrier film 50c may not be able to be sufficiently suppressed.

In view of the respects described above, configurations described as embodiments are employed for an electronic device (three-dimensional stacked device) in which upper and lower substrates to be stacked are electrically connected to each other with a conductor via.

First Embodiment

Figure 5:
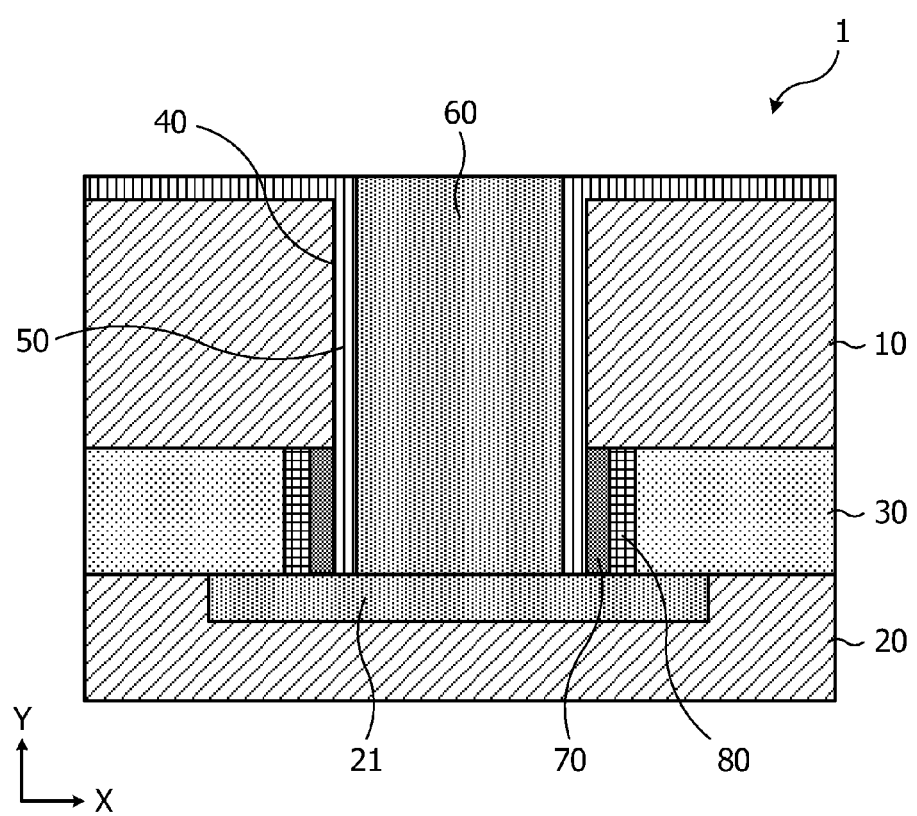
FIG. 5 is a view illustrating an example of an electronic device according to a first embodiment.

FIG. 5 is a view illustrating an example of an electronic device according to the first embodiment. FIG. 5 schematically illustrates a cross-sectional view of a principal portion of an example of the electronic device according to the first embodiment.

An electronic device 1 illustrated in FIG. 5 is a three-dimensional stacked device and contains an upper substrate 10, a lower substrate 20, and a resin layer 30 disposed between the substrate 10 and the substrate 20.

For each of the substrate 10 and the substrate 20, a wafer on which a predetermined circuit containing elements, such as a transistor and wiring, is formed may be used. For example, for each of the substrate 10 and the substrate 20, a wafer before dicing on which semiconductor chips are formed using a semiconductor substrate, such as a Si substrate, is used. For the wafer, a 10-μm-thick wafer may be used, for example. In addition, for each of the substrate 10 and the substrate 20, a semiconductor chip on which a predetermined circuit containing elements, such as a transistor and wiring, is formed, for example, individualized semiconductor chips obtained after dicing of a wafer, may be used.

For the resin layer 30, various kinds of resin materials may be used. For example, BenzoCycloButene (BCB) is used for the resin layer 30. In addition, resin materials, such as epoxy, may be used for the resin layer 30. The thickness of the resin layer 30 may be set to 5 μm, for example.

The upper substrate 10 and the lower substrate 20 are bonded to each other using the resin layer 30 interposed therebetween.

The electronic device 1 illustrated in FIG. 5 further contains a hole 40 which penetrates the substrate 10 and the resin layer 30 and a barrier film 50 and a conductor via 60 which are disposed in the hole 40.

The hole 40 penetrates the upper substrate 10 and the resin layer 30 so as to reach a conductor portion 21 (wiring or pad disposed in wiring) disposed in the lower substrate 20. The diameter of the hole 40 is set to 10 μm, for example.

The barrier film 50 is disposed in such a manner as to cover the inner wall of the hole 40. FIG. 5 illustrates the barrier film 50 disposed on the inner wall of the hole 40 and the upper surface of the substrate 10 as an example. For the barrier film 50, various kinds of insulating materials may be used. For the barrier film 50, inorganic insulating materials, such as SiO and SiN, are used, for example. The thickness of the barrier film 50 may be set to 0.5 μm, for example.

The conductor via 60 is disposed in the hole 40, the inner wall of which is covered with the barrier film 50. Various kinds of conductive materials may be used for the conductor via 60. For example, Cu or a material containing Cu is used for the conductor via 60. The conductor via 60 penetrates the upper substrate 10 and the resin layer 30 and is electrically connected to the conductor portion 21 of the lower substrate 20. By the conductor via 60, circuits contained in the upper substrate 10 and the lower substrate 20 are electrically connected to each other. The conductor via 60 is also referred to as a TSV.

FIG. 5 illustrates one conductor via 60, however, a plurality of conductor vias 60 (and conductor portions 21 of the lower substrate 20) may be contained in the electronic device 1.

The electronic device 1 illustrated in FIG. 5 further contains a film 70 and a film 80 disposed together with the resin layer 30 between the upper substrate 10 and the lower substrate 20.

The film 70 is disposed between the barrier film 50 and the resin layer 30. The film 80 is disposed between the film 70 and the resin layer 30. The film 70 surrounds the outside of the barrier film 50 disposed on the side wall of the conductor via 60 between the upper substrate 10 and the lower substrate 20, the film 80 surrounds the outside of the film 70, and the resin layer 30 surrounds the outside of the film 80.

For the film 70, a material having a thermal expansion coefficient lower than the thermal expansion coefficient of a material to be used for the resin layer 30 is used. For example, a material having a thermal expansion coefficient between the thermal expansion coefficient of the material to be used for the resin layer 30 and the thermal expansion coefficient of a material to be used for the conductor via 60 is used for the film 70. For the film 70, a material having a glass transition point equal to or higher than a temperature applied to the electronic device 1 in the manufacturing and the use of the electronic device 1, for example, 220° C. or higher, or a material not having a glass transition point is used. More specifically, for the film 70, a material which is not softened at the temperature applied to the film 70 in the manufacturing and the use of the electronic device 1 is used. For the film 70, a material having an elastic modulus which may suppress expansion of the conductor via 60 as described later, for example, a material having an elastic modulus of 3 GPa or more, is desirably used.

For the film 70, an insulating material having the above-described thermal expansion coefficient and the like is used, for example. For the film 70, an inorganic insulating material, such as SiO (TEOS film) formed using TetraEthOxySilane (TEOS), may be used, for example. In addition, organic insulating materials, such as Poly(p-phenyleneBenzobisOxazole)(PBO) resin and thermoplastic polyimide (PolyImide; PI) resin, may also be used for the film 70, for example. The thickness (thickness in the substrate plane direction X) of the film 70 may be set to 0.3 μm to 5.0 μm, for example.

For the film 80, a material having a wide range of elastic modulus, that is, a material having viscoelasticity, is used. For the film 80, a material having a glass transition point equal to or lower than a temperature applied to the electronic device 1 in the manufacturing and the use of the electronic device 1, for example, 0° C. or lower, or a material not having a glass transition point is used. For example, a material (rubber elastic body) which is set up so as to be in a rubber state at the temperature applied to the film 80 in the manufacturing and the use of the electronic device 1 is used for the film 80.

For the film 80, insulating materials having the above-described viscoelasticity and the like are used, for example. For the film 80, a synthetic rubber, such as a silicone rubber and a fluororubber, may be used for example. For the film 80, natural rubber may also be used besides the synthetic rubber. The thickness (thickness in the substrate plane direction X) of the film 80 may be set to 0.3 μm to 5.0 μm, for example.

Table 1 illustrates examples of the materials usable for each of the above-described elements of the electronic device 1 and examples of the elastic modulus (GPa), the thermal expansion coefficient (ppm/° C.), and the glass transition point (° C.) of each material.

TABLE 1

| Element | Material | Elastic modulus (GPa) | Thermal expansion coefficient (ppm/° C.) | Glass transition point (° C.) |
|---|---|---|---|---|
| Substrate | Si | 130.2 | 2.6 | — |
| Conductor via | Cu | 127.5 | 16.6 | — |
| Resin layer | Material A | 2.9 | 52 | ≥350 |
|  | Material B | 0.005 | 161 | ≥150 |
|  |  | 1 | 76 | <150 |
| Barrier film | SiO | 75 | 0.5 | — |
|  | SiN | 280 | 3 | — |
| Inside film | TEOS film | 8 | 17 | — |
|  | PBO resin | 3.9 | 30 | ≥220 |
|  | Thermoplastic PI resin | 75 | 20 | 250 |
| Outside film | Silicone rubber (gel) | 0.01-0.1 | 250-400 | <0 |
|  | Fluororubber | 0.01-0.1 | 160 | <0 |

The physical property values in Table 1 are shown as an example and are not limited only to the indicated values. The physical property values of each element may vary or may have a wide range according to the aspects, such as the structure, the composition, and the film quality, of each element in some cases.

The thermal expansion coefficients of Si to be used for the substrate 10 and the substrate 20 ("Substrate" of Table 1) are 2.6 ppm/° C. The thermal expansion coefficient of Cu to be used for the conductor via 60 ("Conductor via" of Table 1) is 16.6 ppm/° C. which is higher than the thermal expansion coefficients of Si to be used for the substrate 10 and the substrate 20. The thermal expansion coefficients of materials A and B to be used for the resin layer 30 ("Resin layer" of Table 1) are 52 ppm/° C. to 161 ppm/° C. which are higher than the thermal expansion coefficient of Cu to be used for the conductor via 60. The thermal expansion coefficient of SiO to be used for the barrier film 50 ("Barrier film" of Table 1) is 0.5 ppm/° C. which is lower than all the thermal expansion coefficients of Si to be used for the substrate 10 and the substrate 20, Cu to be used for the conductor via 60, and the materials A and B to be used for the resin layer 30. The thermal expansion coefficient of SiN to be used for the barrier film 50 ("Barrier film" of Table 1) is comparable to the thermal expansion coefficient of Si to be used for the substrate 10 and the substrate 20 and is lower than all the thermal expansion coefficients of Cu to be used for the conductor via 60 and the materials A and B to be used for the resin layer 30.

For the film 70 ("Inside film" of Table 1), materials having a thermal expansion coefficient between the thermal expansion coefficients of Cu to be used for the conductor via 60 and the materials A and B to be used for the resin layer 30, for example, a thermal expansion coefficient of 17 ppm/° C. to 50 ppm/° C., may be used. Examples of such materials include the TEOS film (17 ppm/(° C.)), the PBO resin (30 ppm/(° C.)), and the thermoplastic PI resin (20 ppm/(° C.)) described above and shown in Table 1. The TEOS film does not have a glass transition point, the PBO resin has a glass transition point of 220° C. or higher, and the thermoplastic PI resin has a glass transition point of 250° C. The elastic moduli of all of the TEOS film, the PBO resin, and the thermoplastic PI resin are 3 GPa or more.

For the film 80 ("Outside film" of Table 1), materials having viscoelasticity in which the elastic modulus has a wide range may be used. Examples of such materials include the silicone rubber (gel) and the fluororubber described above and shown in Table 1. Both the silicone rubber and the fluororubber have a viscoelasticity in which the elastic modulus varies in the range of 0.01 GPa to 0.1 GPa. The glass transition points of both the silicone rubber and the fluororubber are less than 0° C.

As described above, in the electronic device 1, the film 70 having the above-described thermal expansion coefficients is disposed on the outside of the conductor via 60 and the film 80 having the above-described viscoelasticity is further disposed on the outside of the film 70. Thus, a stress applied to the barrier film 50 in heating and subsequent cooling is reduced and interface peeling (the formation of a gap) of the barrier film 50 is suppressed.

Figure 6A:
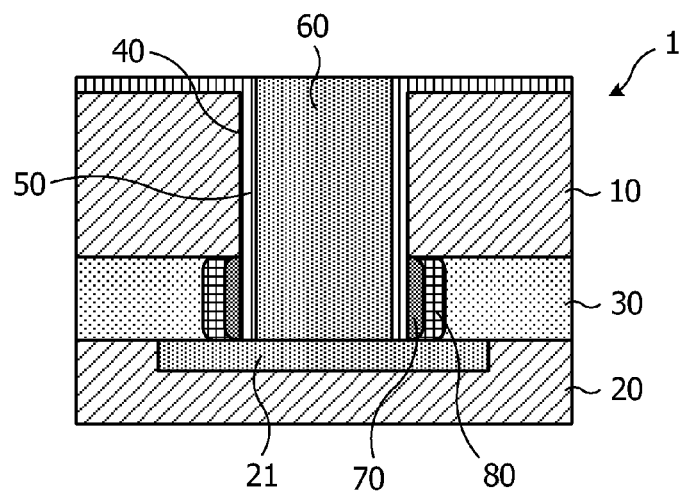
FIGS. 6A to 6C are explanatory views (No. 1) of a state where the electronic device according to the first embodiment is heated and cooled.
Figure 6B:
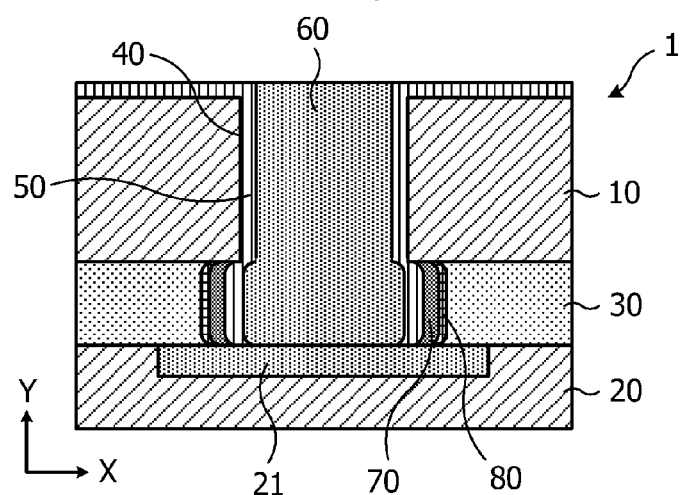
Figure 6C:
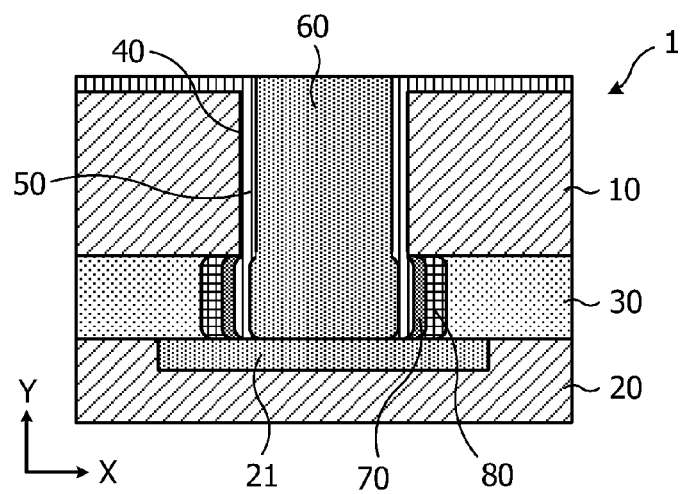
Figure 7A:
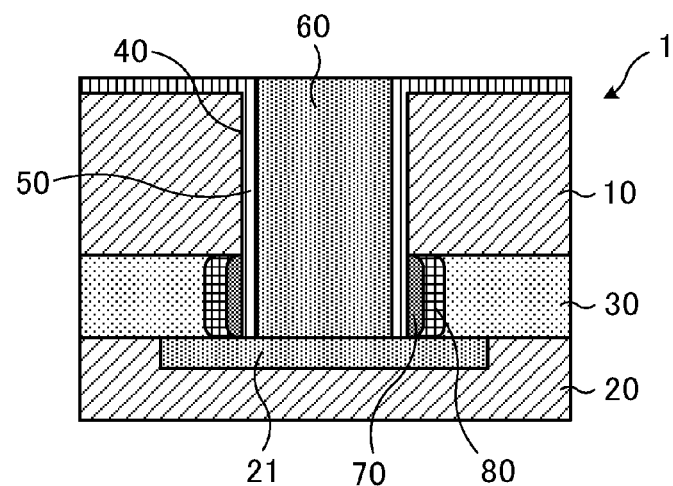
FIGS. 7A to 7C are explanatory views (No. 2) of a state where the electronic device according to the first embodiment is heated and cooled.
Figure 7B:
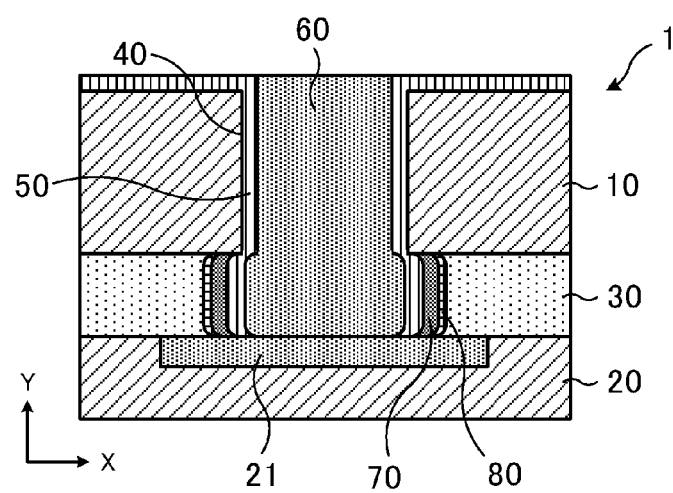
Figure 7C:
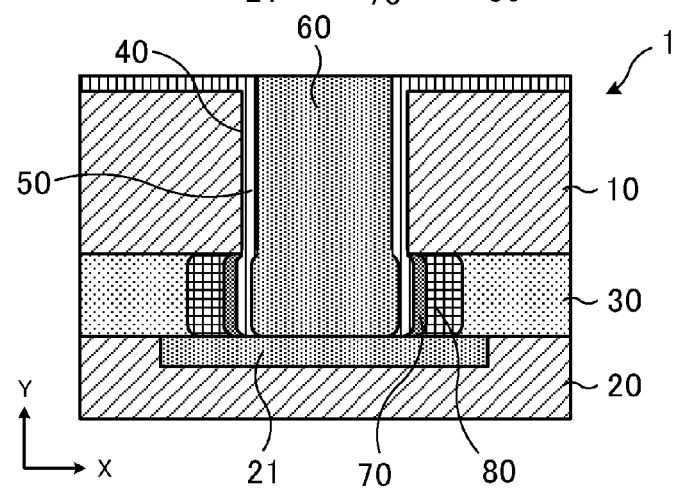

FIG. 6A to FIG. 7C are explanatory views of the state where the electronic device according to the first embodiment is heated and cooled. Herein, FIGS. 6A to 6C are views illustrating an example of a state where the conductor via 60 is expanded and contracted. FIGS. 7A to 7C are views illustrating an example of a state where the resin layer 30 is softened and the resin layer 30 is cured and contracted. FIG. 6A to FIG. 7C schematically illustrate cross-sectional views of a principal portion in each state of the electronic device according to the first embodiment.

The state where the conductor via 60 is expanded and contracted is first described with reference to FIGS. 6A to 6C.

When the electronic device 1 is subjected to the processes including heating (process of forming a cap film and a re-wiring layer on the substrate 10, process of further joining another substrate onto the substrate 10, and the like) as illustrated in FIG. 6A (FIG. 5), the expansion of the conductor via 60 occurs. The expansion of the conductor via 60 is likely to occur in a portion of the resin layer 30 interposed between the substrate 10 and the substrate 20 as illustrated in FIG. 6B. For example, when Si is used for the substrate 10 and Cu is used for the conductor via 60 as shown in Table 1, the Si and the Cu have comparable elastic moduli and the thermal expansion coefficient of Cu is higher. The materials A and B to be used for the resin layer 30 have a higher thermal expansion coefficient and a lower elastic modulus than those of Cu. Therefore, the expansion of the conductor via 60 by heating is suppressed in the substrate 10 portion and is likely to occur in the resin layer 30 portion.

However, in the electronic device 1, the film 70 having a thermal expansion coefficient between the thermal expansion coefficients of the conductor via 60 and the resin layer 30 is disposed inside and the film 80 having viscoelasticity is disposed outside between the conductor via 60 (barrier film 50 on the side wall) and the resin layer 30. Thus, the expansion of the conductor via 60 in the region between the substrate 10 and the substrate 20 is suppressed by the inside film 70 having a thermal expansion coefficient lower than that of the conductor via 60 in the heating as illustrated in FIG. 6B and also is absorbed by contraction deformation due to the viscoelasticity of the outside film 80 having viscoelasticity.

Moreover, as illustrated in FIG. 6C, in cooling after the heating, the conductor via 60 and the inside film 70 are contracted and the barrier film 50 is also contracted. A space between the inside film 70, which follows the contraction of the conductor via 60 through the barrier film 50, and the resin layer 30 is filled with the outside film 80 that changes its form by the elongation deformation from the contracted state (FIG. 6B) due to the viscoelasticity. Or, the outside film 80 causes the barrier film 50 and the inside film 70 to follow the contraction of the conductor via 60 by the elongation deformation from the contracted state (FIG. 6B) due to the viscoelasticity and a space between the inside film 70 and the resin layer 30 is filled with the outside film 80.

On the other hand, the resin layer 30 is softened in the heating and is cured and contracted in the subsequent cooling depending on the material. The state where the resin layer 30 is softened and the resin layer 30 is cured and contracted is described with reference to FIGS. 7A to 7C.

When the electronic device 1 illustrated in FIG. 7A (FIG. 5) is subjected to the process including heating similarly to the case described above, the expansion of the conductor via 60 occurs. The expansion of the conductor via 60 is likely to occur in the resin layer 30 portion which is softened by the heating as illustrated in FIG. 7B. However, in the electronic device 1, the expansion of the conductor via 60 during the heating as illustrated in FIG. 7B is suppressed by the inside film 70 having a thermal expansion coefficient lower than that of the conductor via 60 and also is absorbed by contraction deformation due to the viscoelasticity of the outside film 80 having viscoelasticity.

Moreover, as illustrated in FIG. 7C, in cooling after the heating, the conductor via 60, the barrier film 50, and the inside film 70 are contracted and the resin layer 30 softened by the heating is cured and contracted. A space between the inside film 70, which follows the contraction of the conductor via 60 through the barrier film 50, and the resin layer 30, which is cured and contracted, is filled with the outside film 80 that changes its form by the elongation deformation due to the viscoelasticity. Or, the outside film 80 causes the barrier film 50 and the inside film 70 to follow the contraction of the conductor via 60 by the elongation deformation due to the viscoelasticity and a space between the inside film 70 and the resin layer 30 which is cured and contracted is filled with the outside film 80.

In the electronic device 1, even when the heating process including heating and subsequent cooling is repeated, the outside film 80 having viscoelasticity absorbs the mismatch of the expansion amount and the contraction amount among the conductor via 60, the barrier film 50, the inside film 70, and the resin layer 30 by contracting and elongation. Due to the fact that the outside film 80 having viscoelasticity act as described above, the formation of a gap in the region between the conductor via 60 and the resin layer 30 may be suppressed and the application of an excessive stress on the barrier film 50 may be suppressed. Thus, by suppressing the formation of a gap and suppressing an excessive stress on the barrier film 50, the formation of a crack in the barrier film 50 may be suppressed. This makes it possible to suppress the reduction in the barrier property of the barrier film 50, suppress the diffusion of the components of the conductor via 60, and suppress the short circuit of the circuit in the substrate 10, the deterioration of the characteristics of the elements, such as a transistor, an increase in the resistance of the conductor via 60, and the like caused by the diffusion of the components to thereby realize the electronic device 1 with high characteristics and high reliability.

Then, the simulation results of the stress in the electronic device 1 and the like described above are described.

Figure 8A:
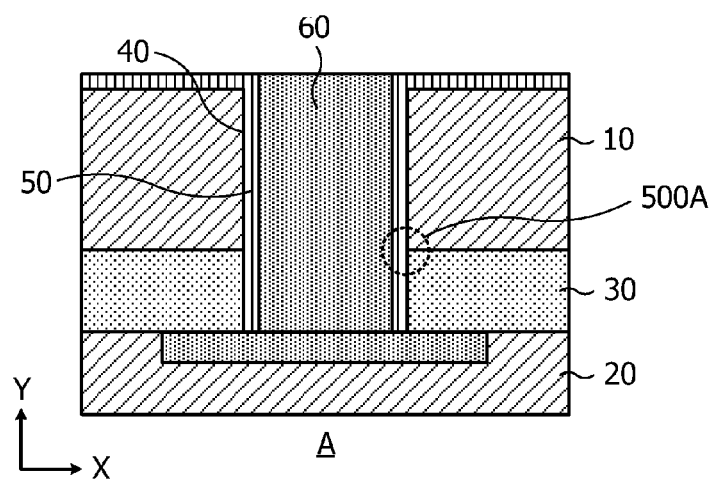
FIGS. 8A to 8C are views illustrating models used for simulation.
Figure 8B:
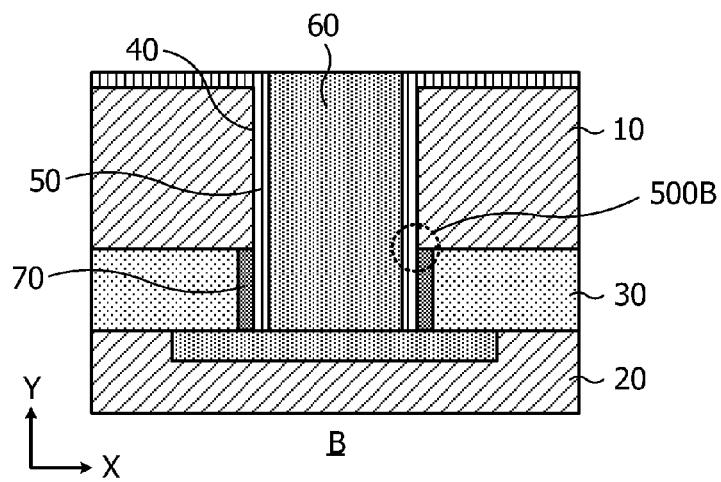
Figure 8C:
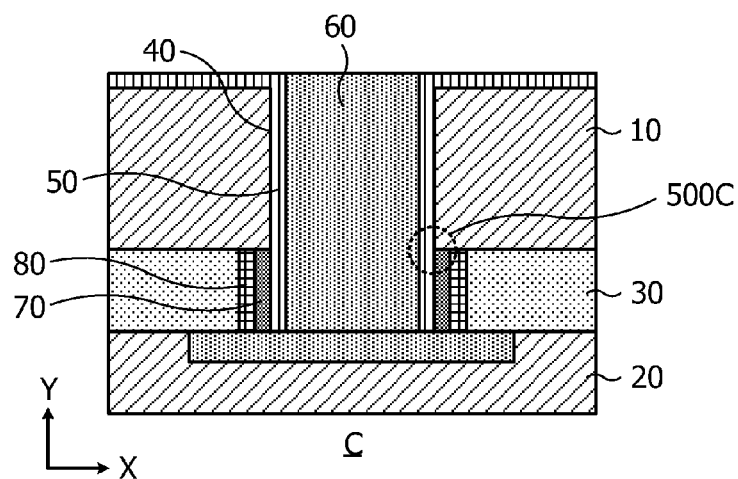

FIGS. 8A to 8C are views illustrating models used for the simulation.

A model A of FIG. 8A, a model B of FIG. 8B, and a model C of FIG. 8C contain the upper substrate 10 and the lower substrate 20, the resin layer 30 therebetween, the conductor via 60 which penetrates the substrate 10 and the resin layer 30 to reach the conductor portion 21 of the substrate 20, and the barrier film 50 on the side surface of the conductor via 60. The model A of FIG. 8A is a model in which the barrier film 50 and the resin layer 30 are in contact with each other. The model B of FIG. 8B is a model in which the film 70 having a predetermined thermal expansion coefficient is interposed between the barrier film 50 and the resin layer 30. The model C of FIG. 8C is a model in which the film 70 having a predetermined thermal expansion coefficient and the film 80 having predetermined viscoelasticity are interposed between the barrier film 50 and the resin layer 30 and is a model equivalent to the above-described electronic device 1.

The contour diagram of a residual stress at 25° C. was obtained by the simulation for each of the models A, the model B, and the model C. From each of the obtained contour diagrams, the tensile stress ($\sigma_x$ component) value in the substrate plane direction X of each of a portion 500A of the model A, a portion 500B of the model B, and a portion 500C of the model C was read.

Figure 9:
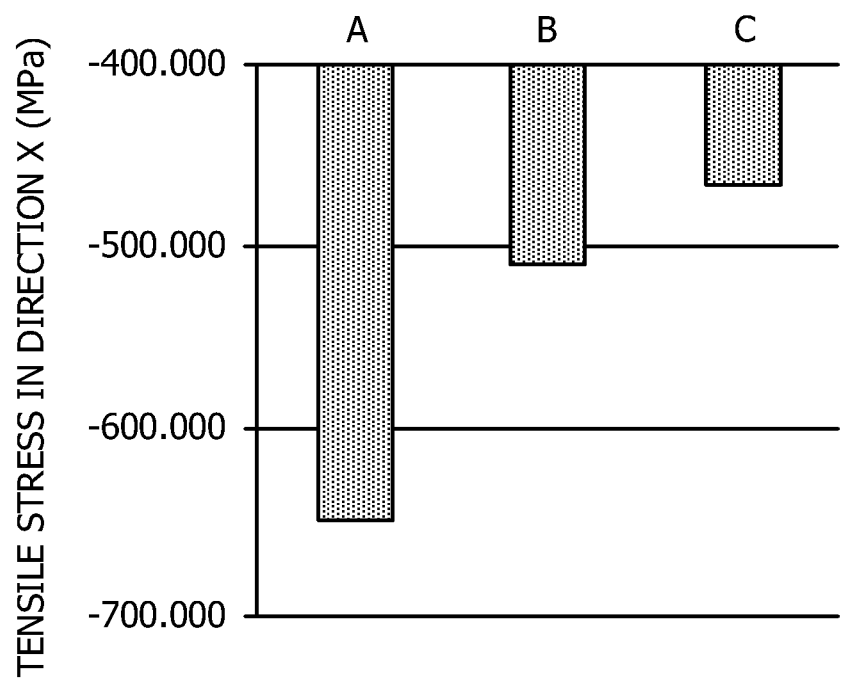
FIG. 9 is a view of tensile stress values obtained from the simulation.

FIG. 9 depicts the tensile stress (MPa) values obtained from the simulation. It is found from the comparison between the tensile stress values obtained for the model A and the model B that the tensile stress is reduced by providing the film 70 having a predetermined thermal expansion coefficient between the barrier film 50 and the resin layer 30 as in the model B. It is found from the comparison between the tensile stress values obtained for the model B and the model C that the tensile stress is further reduced by providing the film 80 having predetermined viscoelasticity between the barrier film 50 and the resin layer 30 in addition to the film 70 as in the model C.

By providing the film 70 and the film 80, a reduction in the residual stress in a predetermined portion of the barrier film 50 where a crack may be formed unless the films are disposed may be achieved.

Second Embodiment

Figure 10:
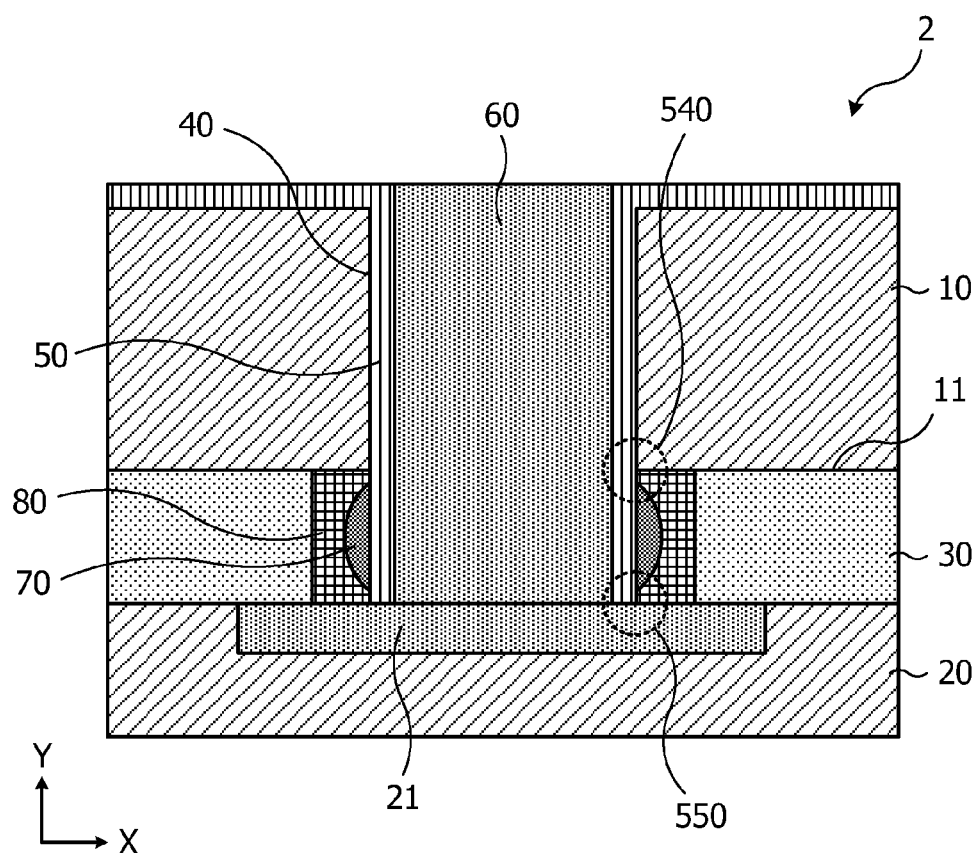
FIG. 10 is a view illustrating an example of an electronic device according to a second embodiment.

FIG. 10 is a view illustrating an example of an electronic device according to the second embodiment. FIG. 10 schematically illustrates a cross-sectional view of a principal portion of an example of the electronic device according to the second embodiment.

In an electronic device 2 illustrated in FIG. 10, an upper portion and a lower portion of a film 80 disposed between a barrier film 50 and a resin layer 30 and having viscoelasticity extend to the barrier film 50 and a film 70 having a predetermined thermal expansion coefficient is disposed inside such a film 80. More specifically, in the film 70, an upper end portion and a lower end portion in a substrate stacking direction Y besides the side surface in the substrate plane direction X are covered with the film 80. The electronic device 2 according to the second embodiment is different from the electronic device 1 according to the first embodiment described above in having such a structure.

A residual stress generated on the barrier film 50 tends to become relatively high in and in the vicinity (portion 540) of a contact portion of a bottom surface 11 of the upper substrate 10 and the barrier film 50 and also tends to become relatively high also in and in the vicinity (portion 550) of a contact portion of a conductor portion 21 of the lower substrate 20 and the barrier film 50. In view of such a respect, the electronic device 2 is structured so that the film 80 having viscoelasticity is disposed also in the portion 540 and the portion 550 and the upper end portion and the lower end portion of the film 70 are covered with the film 80 as illustrated in FIG. 10.

In the electronic device 2, the residual stress on the barrier film 50 in the substrate plane direction X in the portions 540 and 550 is reduced by the film 70 and the film 80 disposed outside the film 70 and the residual stress on the barrier film 50 in the substrate stacking direction Y in the portions 540 and 550 is reduced by the film 70 and the film 80 of the upper end portion and the lower end portion of the film 70. By employing the structure illustrated in FIG. 10, a reduction in the residual stress in the portion 540 and the portion 550 may be achieved and a reduction in the barrier property of the barrier film 50 due to the residual stress may be suppressed, so that the electronic device 2 with high characteristics and high reliability may be realized.

Third Embodiment

An example of a method for forming an electronic device (three-dimensional stacked device) in which an upper substrate and a lower substrate to be stacked are electrically connected to each other with a conductor via is described as the third embodiment.

The formation of the three-dimensional stacked device includes processes different in the TSV formation stage of Via first (TSV is formed before transistor formation), Via middle (TSV is formed after transistor formation and before wiring formation), and Via last (TSV is formed after transistor and wiring formation). Moreover, the process varies depending on the TSV formation manner, that is, the TSV is formed from the circuit surface side of the substrate and the TSV is formed from the back surface side opposite to the circuit surface of the substrate. Herein, the via-last method is described as an example which includes thinning a substrate on which a circuit (device layer) is formed, stacking the thinned substrate on a lower substrate, and then forming a TSV from the circuit surface side of the stacked upper substrate.

FIG. 11A to FIG. 16 are explanatory views of an example of the electronic device forming method according to the third embodiment. Hereinafter, each process of the electronic device forming method according to the third embodiment is described in order.

Figure 11A:
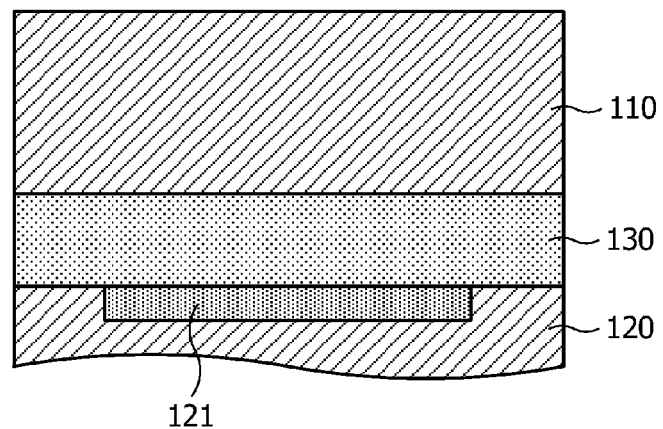
FIGS. 11A and 11B are explanatory views (No. 1) of an example of an electronic device forming method according to a third embodiment.

FIG. 11A is a schematic cross-sectional view of a principal portion of an example of a first substrate stacking process according to the third embodiment.

First, an upper substrate 110 and a lower substrate 120 to be stacked are prepared. As the upper substrate 110 and the lower substrate 120, those on which a predetermined circuit containing elements, such as a transistor and wiring, is formed are prepared. Among the above, with respect to the upper substrate 110, the circuit surface (front surface) is bonded to a support, such as glass, using an adhesive, and then a surface (back surface) opposite to the circuit surface is ground by grinding processing. The substrate 110 thinned to a desired thickness by the grinding is bonded to a substrate 120 (may not be thinned) on which the substrate 110 is to be stacked through a resin layer 130, such as a permanent adhesive. Thus, the structure illustrated in FIG. 11A is obtained.

For the upper substrate 110, one thinned up to 10 µm in thickness by grinding is used, for example. On the lower substrate 120, a conductor portion 121 (pad) which may be electrically connected to a conductor via 160 (TSV) described later is formed. On the substrate 120, an insulating film, such as an oxide film, is also formed but only the conductor portion 121 is illustrated herein. For the resin layer 130, BCB is used, for example. The thickness of the resin layer 130 is set to 5 µm, for example.

Figure 11B:
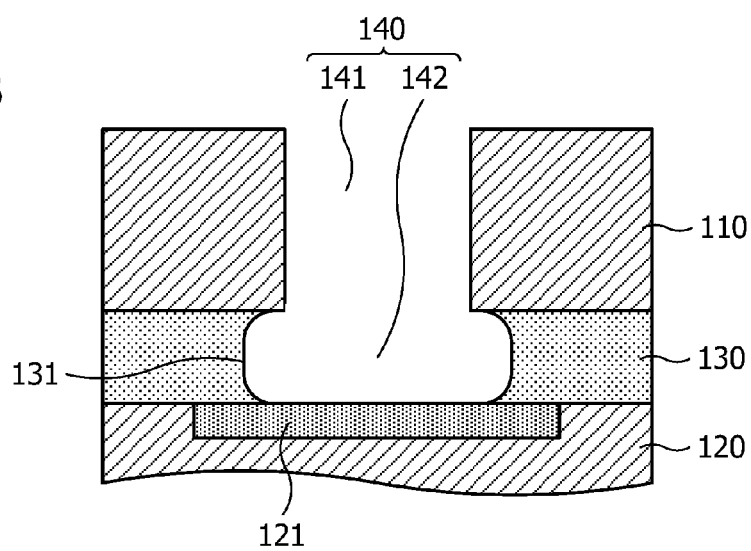

FIG. 11B is a schematic cross-sectional view of a principal portion of an example of a hole formation process according to the third embodiment.

After stacking the substrate 110 and the substrate 120 through the resin layer 130, a hole 140 (hole 141 and hole 142) which penetrates the substrate 110 to reach the conductor portion 121 of the substrate 120 is formed as illustrated in FIG. 11B. The hole 140 is formed by etching the substrate 110 and the resin layer 130 using a resist mask.

The substrate 110 is etched using mixed gas of sulfur hexafluoride ($SF_6$) and perfluorocyclobutane ($C_4F_8$). Thus, a hole 141 which penetrates the substrate 110 is formed. The diameter of the hole 141 is set to 10 µm, for example. The resin layer 130 is etched using mixed gas of tetrafluoromethane ($CF_4$) and oxygen ($O_2$). Thus, a hole 142 which penetrates the resin layer 130 is formed. Since the anisotropy of etching of the resin layer 130 containing an organic material, such as BCB, is weaker as compared with the substrate 110 containing Si as the main component, the resin layer 130 is side etched in such a manner as to enter below the substrate 110. Therefore, an undercut 131 is formed in the resin layer 130, so that the opening diameter of the hole 142 becomes larger than the opening diameter of the hole 141.

Figure 12A:
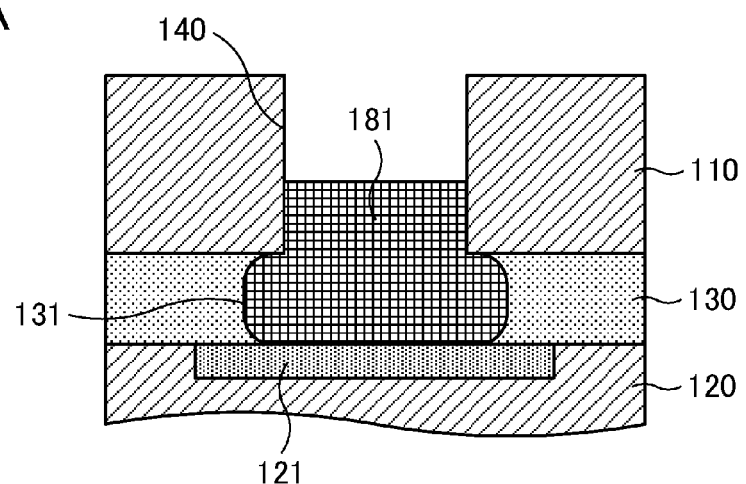
FIGS. 12A and 12B are explanatory views (No. 2) of an example of the electronic device forming method according to the third embodiment.

FIG. 12A is a schematic cross-sectional view of a principal portion of an example of a first material formation process according to the third embodiment.

After the formation of the hole 140, a material 181 of a film having viscoelasticity is formed in the hole 140 as illustrated in FIG. 12A. For example, a fluororubber coating which is a latex material is spray-applied into the hole 140, and then cured at 120° C. to thereby form the material 181 in the hole 140. The material 181 is formed in the hole 140 to have a thickness equal to or larger than the thickness of the resin layer 130 to thereby fill the undercut 131 with the material 181.

Figure 12B:
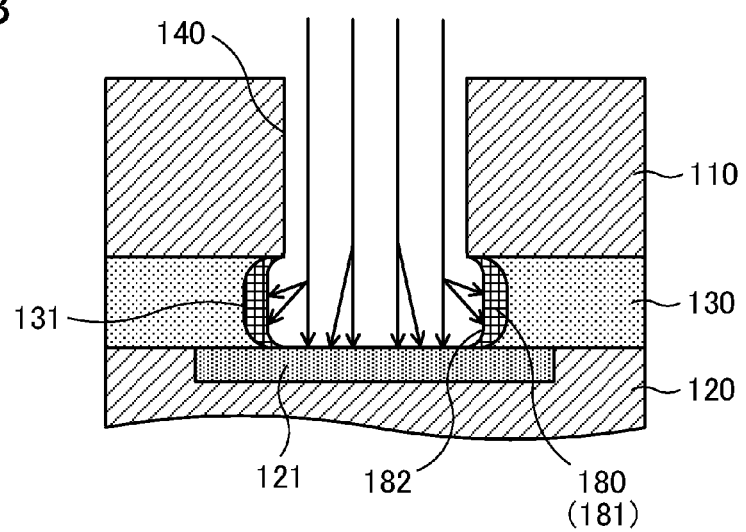

FIG. 12B is a schematic cross-sectional view of a principal portion of an example of a first material etching process according to the third embodiment.

After the formation of the material 181, the material 181 is etched (illustrated by the arrows) to form a film 180 having viscoelasticity on the inner wall of the resin layer 130 as illustrated in FIG. 12B. For the etching of the material 181, mixed gas of ammonia ($NH_3$) and $O_2$ is used. Similarly to the case of the etching of the resin layer 130, since the anisotropy of etching of the material 181 is weaker as compared with the substrate 110, an undercut 182 is formed in the film 180 obtained by the etching. The thickness in the substrate plane direction X of the film 180 is about 1 µm.

Figure 13A:
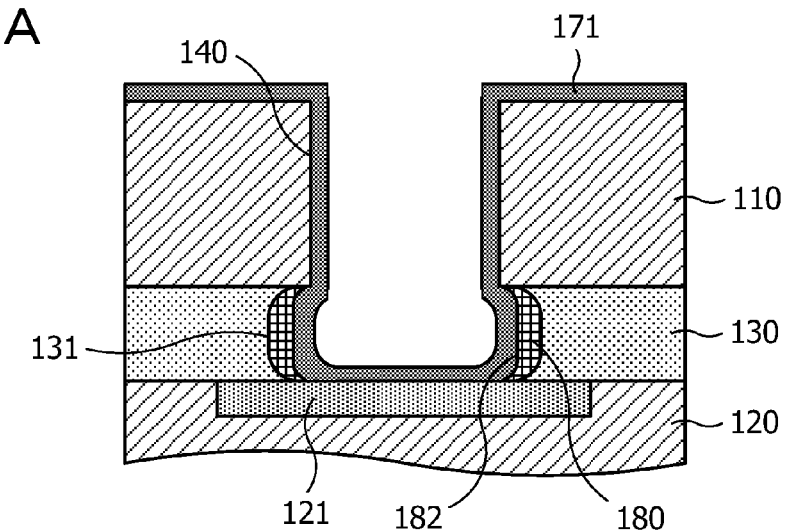
FIGS. 13A and 13B are explanatory views (No. 3) of an example of the electronic device forming method according to the third embodiment.

FIG. 13A is a schematic cross-sectional view of a principal portion of an example of a second material formation process according to the third embodiment.

After the formation of the film 180 having viscoelasticity, a material 171 of a film having a thermal expansion coefficient between the thermal expansion coefficients of the resin layer 130 and a conductor via 160 described later is formed in the hole 140 and on the upper surface of the substrate 110 as illustrated in FIG. 13A. For example, a TEOS film is deposited as the material 171 by a plasma CVD method using mixed gas of gasified TEOS and $O_2$. When the deposition speed is 500 nm/min, a TEOS film of about 1 µm may be formed in 2 minutes. The TEOS film formed by the CVD method has good covering property, and thus may be formed also on the side wall of the undercut 182 of the previously formed film 180.

Figure 13B:
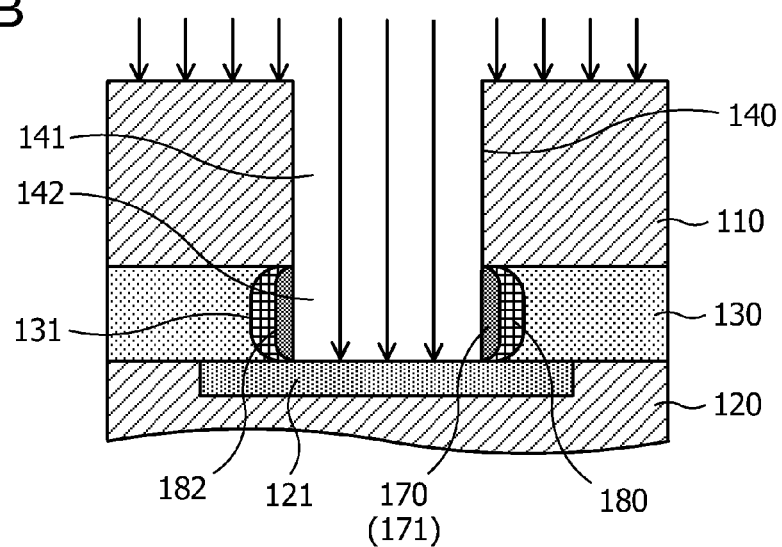

FIG. 13B is a schematic cross-sectional view of a principal portion of an example of a second material etching process according to the third embodiment.

After the formation of the material 171, the material 171 is etched (illustrated by the arrows) to remove the material 171 formed on the upper surface of the substrate 110, the side wall of the hole 141 of the substrate 110, and the upper surface of the conductor portion 121 of the substrate 120 as illustrated in FIG. 13B. In this case, by anisotropically etching the material 171, the material 171 formed on the outside with respect to the internal diameter of the hole 141 of the substrate 110 (resin layer 130 side) remains. Thus, the film 170 having a predetermined thermal expansion coefficient is formed on the side wall of the undercut 182 of the film 180 in the hole 142 of the resin layer 130. The thickness in the substrate plane direction X of the film 170 is about 0.5 jam.

Figure 14A:
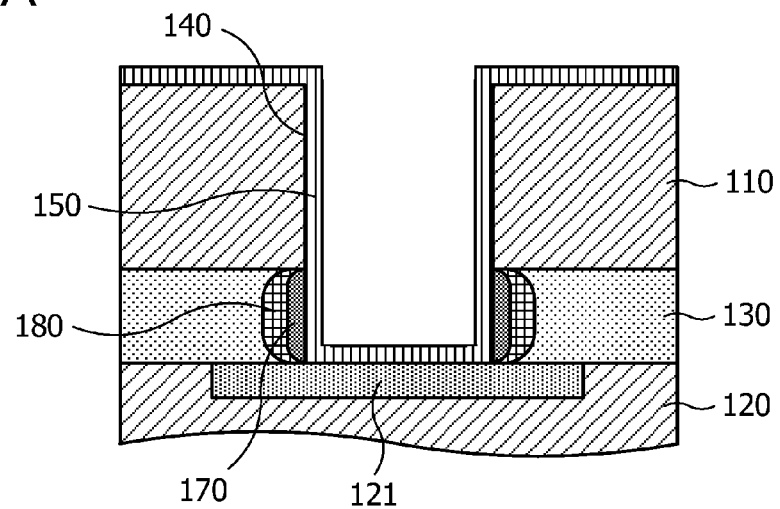
FIGS. 14A and 14B are explanatory views (No. 4) of an example of the electronic device forming method according to the third embodiment.

FIG. 14A is a schematic cross-sectional view of a principal portion of an example of a barrier film formation process according to the third embodiment.

After the formation of the film 180 having viscoelasticity and the film 170 having a predetermined thermal expansion coefficient as described above, a barrier film 150 is formed in the hole 140 and on the upper surface of the substrate 110 as illustrated in FIG. 14A. For example, when a SiN film is formed as the barrier film 150, the SiN film is formed by a CVD method using mixed gas of silane ($SiH_4$) and $NH_3$. The thickness of the SiN film to be formed is set to 0.5 µm, for example.

Figure 14B:
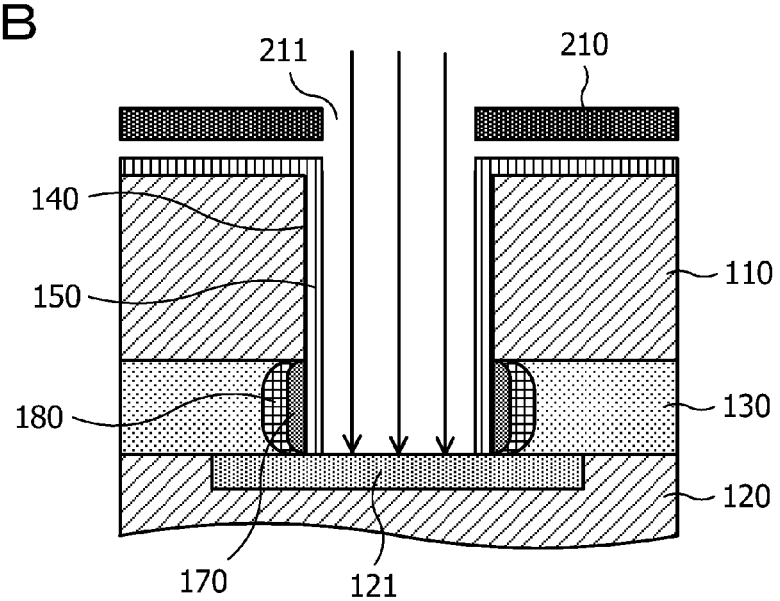

FIG. 14B is a schematic cross-sectional view of a principal portion of an example of a barrier film etching process according to the third embodiment.

After the formation of the barrier film 150 in the hole 140 and on the upper surface of the substrate 110, a resist 210 having an opening portion 211 is formed in a region corresponding to the conductor portion 121 (hole 140) of the substrate 120 as illustrated in FIG. 14B. Then, etching is performed (illustrated by the arrows) using the formed resist 210 as a mask to remove the barrier film 150 formed on the conductor portion 121 to thereby expose the conductor portion 121.

Figure 15A:
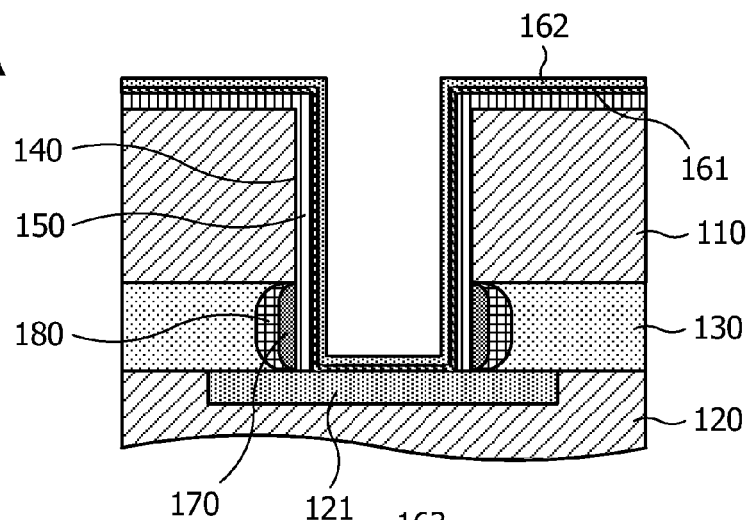
FIGS. 15A to 15C are explanatory views (No. 5) of an example of the electronic device forming method according to the third embodiment.

FIG. 15A is a schematic cross-sectional view of a principal portion of an example of a formation process of a barrier metal layer and a seed layer according to the third embodiment.

After the formation of the barrier film 150 as described above, a barrier metal layer 161 and a seed layer 162 are formed on the barrier film 150 and on the conductor portion 121 in the hole 140 as illustrated in FIG. 15A. The barrier metal layer 161 and the seed layer 162 are formed using a physical vapor deposition (PVD) method, such as sputtering. For example, titanium (Ti) is formed with a thickness of 100 nm as the barrier metal layer 161 and Cu is formed with a thickness of 250 nm as the seed layer 162.

Figure 15B:
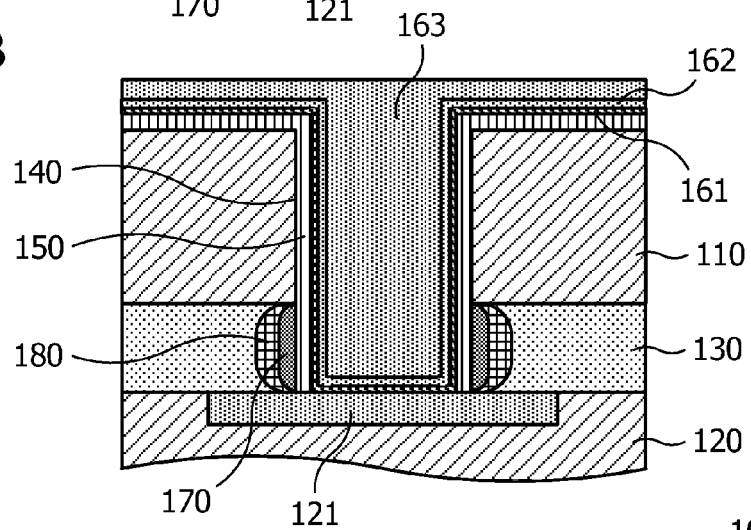

FIG. 15B is a schematic cross-sectional view of a principal portion of an example of a plating process according to the third embodiment.

After the formation of the barrier metal layer 161 and the seed layer 162, a conductor layer 163 is formed by an electrolytic plating method using the barrier metal layer 161 and the seed layer 162 as a power feeding layer as illustrated in FIG. 15B. For example, Cu is deposited by an electrolytic plating method to form the conductor layer 163. The conductor layer 163 is formed with a thickness in such a manner that the inside of the hole 140 is filled with the conductor layer 163 and the conductor layer 163 is deposited up to a level higher than the upper surface of the substrate 110.

When forming the conductor layer 163 by depositing Cu by an electrolytic plating method, annealing is performed after the plating for crystal stabilization of the layer deposited by the plating. In the annealing, the expansion of the conductor layer 163 in heating may be suppressed by the film 170 with an elastic modulus higher than that of the conductor layer 163. On the other hand, in heating and subsequent cooling, similarly as the case described with reference to FIG. 6A to FIG. 7C above, a mismatch of the expansion amount and the contraction amount among the materials of the conductor layer 163, the barrier film 150, the film 170, and the resin layer 130 due to the thermal expansion coefficient differences among the materials may occur. However, due to the fact that the film 180 having viscoelasticity is disposed between the film 170 and the resin layer 130, the mismatch of the expansion amount and the contraction amount among the materials which may occur in the annealing may be absorbed by the contraction and elongation of the film 180.

Figure 15C:
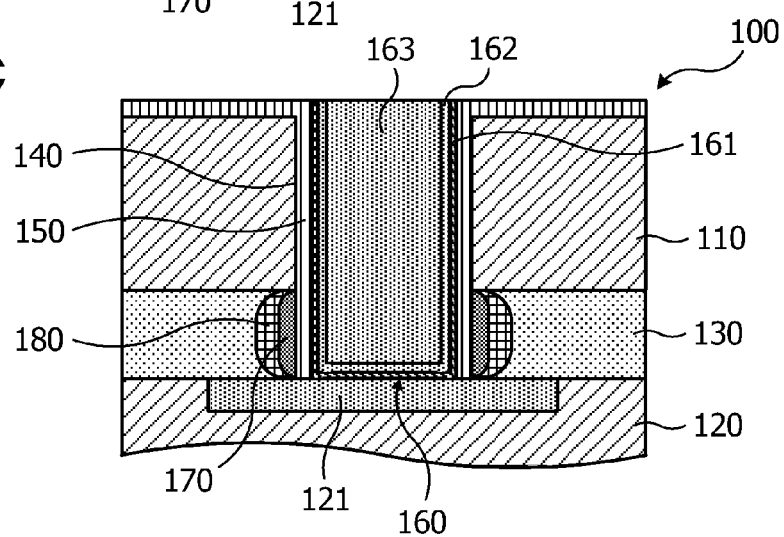

FIG. 15C is a schematic cross-sectional view of a principal portion of an example of a grinding process according to the third embodiment.

After the formation of the conductor layer 163, chemical mechanical polishing (CMP) is performed, as illustrated in FIG. 15C, so as to remove part of the conductor layer 163, the seed layer 162, and the barrier metal layer 161 which are disposed above the barrier film 150 formed on the substrate 110. Thus, a conductor via 160 (barrier metal layer 161, seed layer 162, and a conductor layer 163) which is electrically connected to the conductor portion 121 of the lower substrate 120 is formed in the hole 140 which penetrates the upper substrate 110 and the resin layer 130 and on the inner wall of which the barrier film 150 is formed. In the CMP, the conductor layer 163, the seed layer 162, the barrier metal layer 161, and the barrier film 150 which are formed above the upper surface of the substrate 110 may be removed to thereby form the conductor via 160.

By the processes described above, the electronic device 100 which contains the conductor via 160 which electrically connects the substrate 110 and the substrate 120 and in which the inside film 170 having a predetermined thermal expansion coefficient and the outside film 180 having viscoelasticity are interposed between the barrier film 150 on the side wall of the conductor via 160 and the resin layer 130 is obtained.

On the electronic device 100 thus obtained, another substrate may be further stacked.

Figure 16:
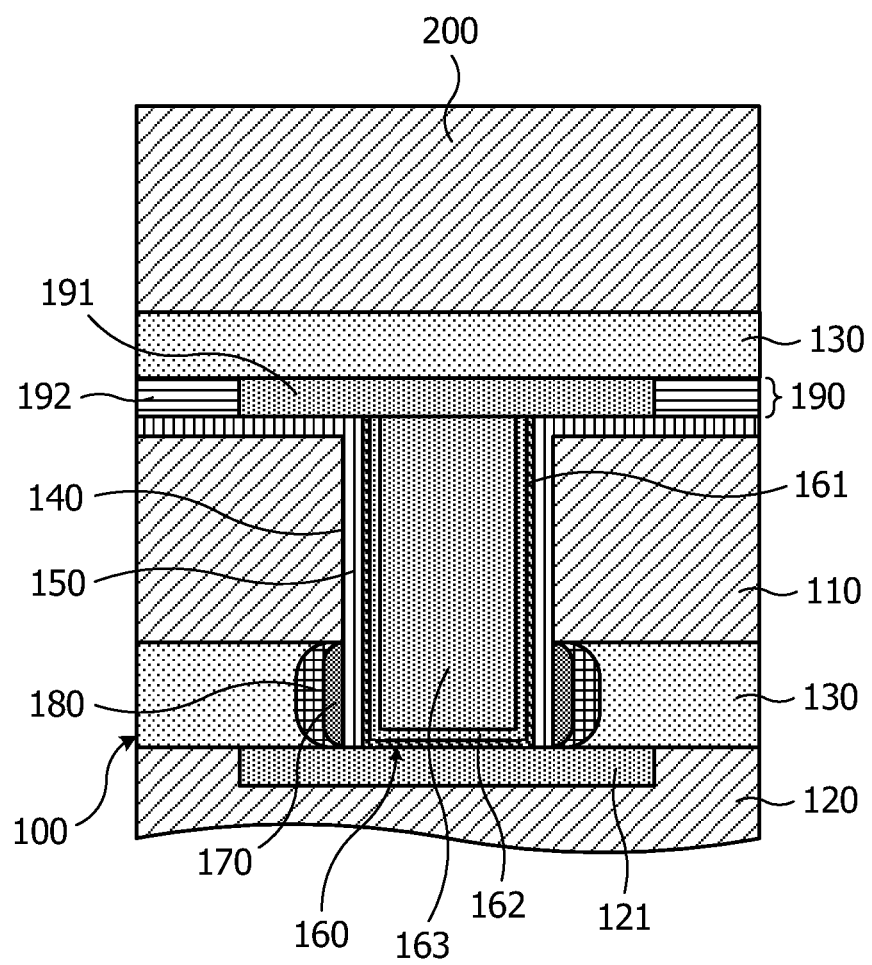
FIG. 16 is an explanatory view (No. 6) of an example of the electronic device forming method according to the third embodiment.

FIG. 16 is a schematic cross-sectional view of a principal portion of an example of a second substrate stacking process according to the third embodiment.

When further stacking another substrate on the electronic device 100 obtained as described above, a re-wiring layer 190 containing a conductor portion 191 (re-wiring or pad) electrically connected to the conductor via 160 and an insulating portion 192 therearound is formed on the electronic device 100 illustrated in FIG. 15C above, for example.

In the formation process of the re-wiring layer 190, heating may be performed in the process of forming the conductor portion 191 and the insulating portion 192. When heating is performed, the expansion of the conductor layer 163 may be suppressed by the film 170 similarly to the case of the annealing described above. In heating and subsequent cooling, a mismatch of the expansion amount and the contraction amount among materials may be absorbed by the contraction and elongation of the film 180 having viscoelasticity.

After the formation of the re-wiring layer 190, a substrate 200 is stacked through a resin layer 130 on the electronic device 100 in which the re-wiring layer 190 is formed similarly to the case described with reference to FIG. 11A above. For the substrate 200, one on which a predetermined circuit containing a transistor, wiring, and the like is formed is used. The substrate 200 is thinned by grinding processing to a desired thickness, and then stacked above the substrate 110 through the resin layer 130 in the same manner as in the substrate 110.

After the process, a conductor via which penetrates the substrate 200 and the resin layer 130 directly under the substrate 200 and is electrically connected to the conductor portion 191 disposed on the substrate 110 may be formed according to the example described with reference to FIG. 11B to FIG. 15C above.

Thus, according the above-described method, the substrate 110 and the substrate 120 on which a predetermined circuit is formed are stacked, and then the conductor via 160 (TSV) is formed. The electronic device 100 obtained by the above-described method has a bumpless stacking structure in which a bump is not used for the electric connection between the upper substrate 110 and the lower substrate 120 (or substrate 200).

The above-described method may also be applied to both cases of a case where the substrate 110 and the substrate 120 (and substrate 200) are semiconductor chips obtained after dicing of a wafer on which semiconductor chips are formed and a case where the substrate 110 and the substrate 120 (and substrate 200) are wafers before dicing on which semiconductor chips are formed.

Herein, an example of a bumpless wafer-on-wafer stacking process in the case of using a wafer before dicing for the substrate 110 and the substrate 120 is further described with reference to FIG. 17A to FIG. 20C described below.

FIG. 17A to FIG. 20C are explanatory views of an example of a stacking process according to the third embodiment. Hereinafter, each process of the stacking process according to the third embodiment is described in order.

Figure 17A:
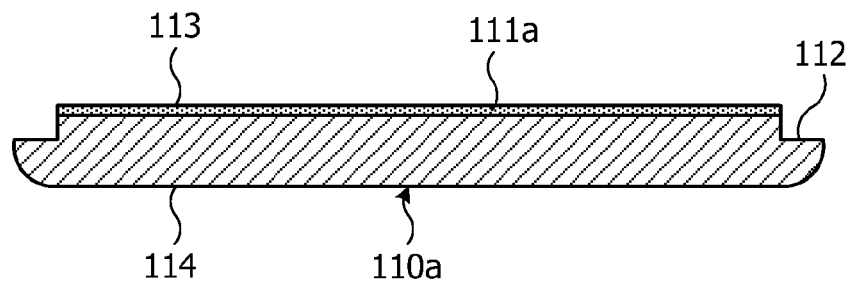
FIGS. 17A to 17C are explanatory views (No. 1) of an example of a stacking process according to the third embodiment.
Figure 17B:
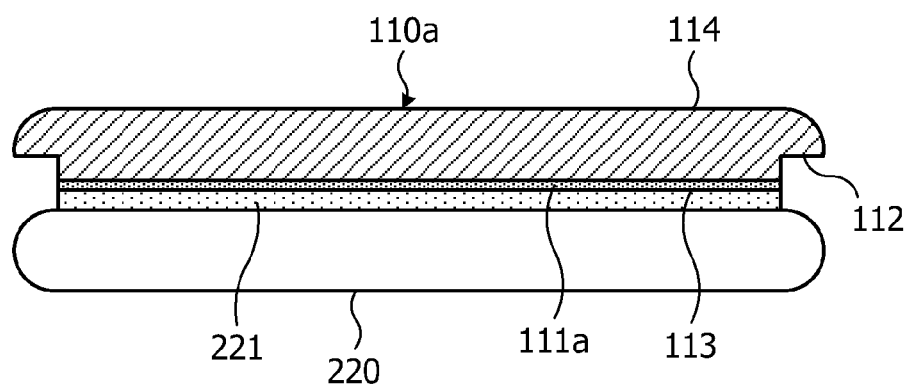
Figure 17C:
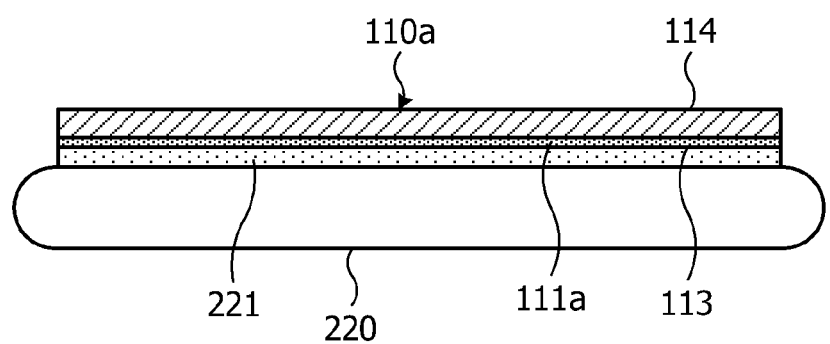

FIG. 17A is a schematic cross-sectional view of a principal portion of an example of a wafer preparation process according to the third embodiment. FIG. 17B is a schematic cross-sectional view of a principal portion of an example of a wafer temporarily bonding process according to the third embodiment. FIG. 17C is schematic cross-sectional view of a principal portion of an example of a wafer thinning process according to the third embodiment.

First, a wafer 110a having a circuit layer 111a on which a predetermined circuit containing a transistor, wiring, and the like is formed is prepared, and then the edge thereof is cut by edge trim processing to form an edge trim 112 as illustrated in FIG. 17A.

Subsequently, the wafer 110a in which the edge trim 112 is formed is bonded onto a support 220 through an adhesive 221 as illustrated in FIG. 17B. In this case, the wafer 110a is bonded with a circuit surface 113 (surface on the circuit layer 111a side) thereof facing the support 220.

Then, a surface (substrate surface) 114 opposite to the circuit surface 113 of the wafer 110a bonded to the support 220 with the adhesive 221 is ground by grinding processing to thin the wafer 110a to 10 µm in thickness, for example, as illustrated in FIG. 17C.

Figure 18A:
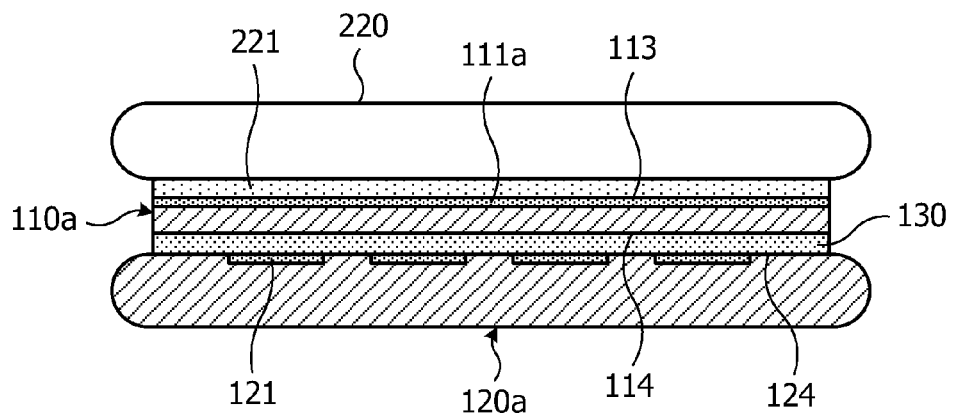
FIGS. 18A and 18B are explanatory views (No. 2) of an example of the stacking process according to the third embodiment.
Figure 18B:
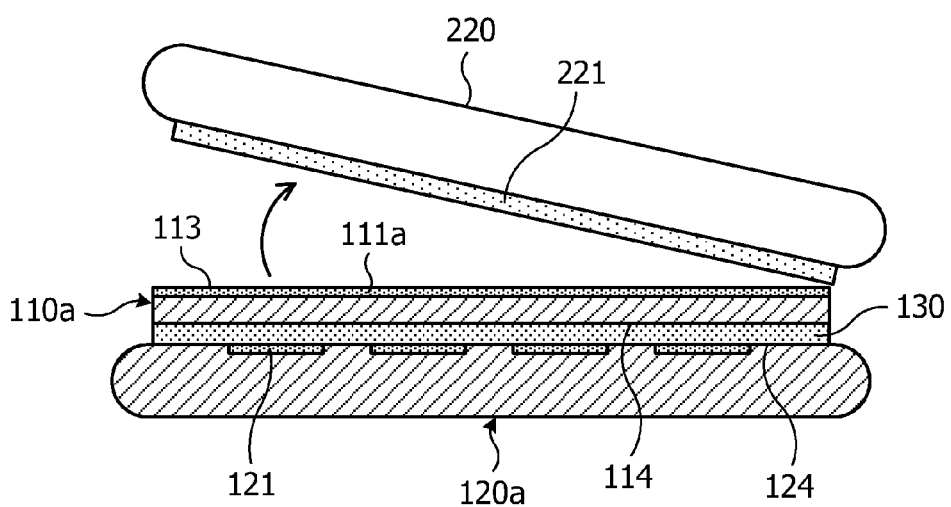

FIG. 18A is a schematic cross-sectional view of a principal portion of an example of a wafer stacking process according to the third embodiment. FIG. 18B is a schematic cross-sectional view of a principal portion of an example of a support removal process according to the third embodiment.

After thinning the wafer 110a, the wafer 110a is bonded to a separately prepared wafer 120a (may not be thinned) through the resin layer 130, such as a permanent adhesive containing an organic material, as illustrated in FIG. 18A. For the wafer 120a, one on which a predetermined circuit containing a transistor, wiring, and the like is formed is used. In FIG. 18A, only conductor portions 121 forming a part of the circuit of the wafer 120a are illustrated for convenience. The bonding of the wafer 120a and the wafer 110a on the support 220 is performed in such a manner that a circuit surface 124 containing the conductor portions 121 of the wafer 120a and the thinned substrate surface 114 of the wafer 110a face each other.

After bonding of the wafer 110a and the wafer 120a through the resin layer 130, the adhesive 221 and the support 220 are peeled as illustrated in FIG. 18B. The peeling of the adhesive 221 and the support 220 may be performed by reducing the adhesive force of the adhesive 221 using methods, such as heat treatment, ultraviolet exposure, and chemical treatment, in accordance with the form of the adhesive 221 and the support 220.

Figure 19A:
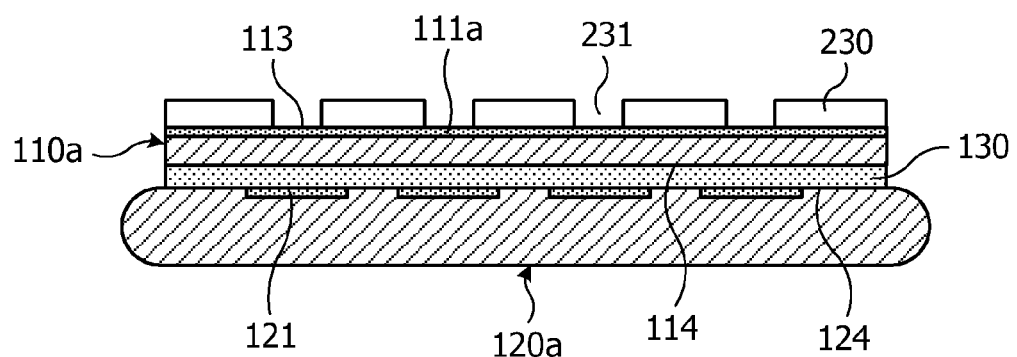
FIGS. 19A and 19B are explanatory views (No. 3) of an example of the stacking process according to the third embodiment.
Figure 19B:
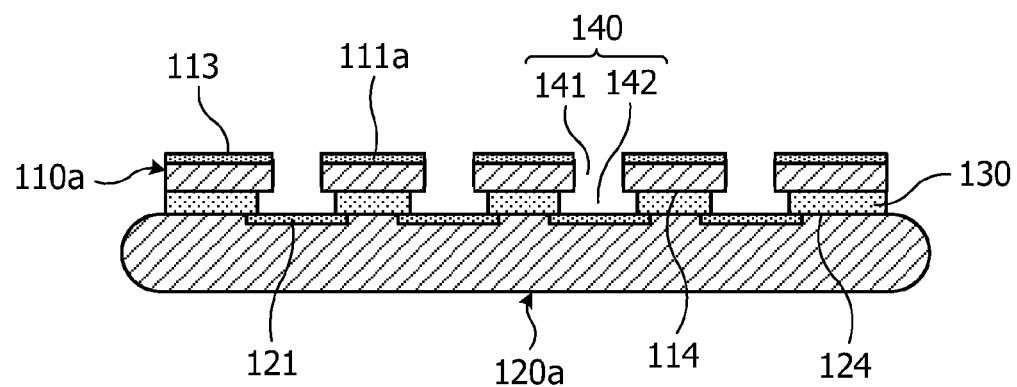

FIG. 19A is a schematic cross-sectional view of a principal portion of an example of a photolithography process according to the third embodiment. FIG. 19B is a schematic cross-sectional view of a principal portion of an example of an etching process according to the third embodiment.

After the peeling of the adhesive 221 and the support 220, a resist 230 having openings 231 in regions corresponding to the conductor portions 121 of the lower wafer 120a is formed on the surface from which the adhesive 221 and the support 220 of the wafer 110a are peeled as illustrated in FIG. 19A.

Then, etching is performed using the resist 230 as a mask to form holes 141 which penetrate the wafer 110a and holes 142 which penetrate the resin layer 130 and have an opening diameter larger than the opening diameter of the hole 141 as illustrated in FIG. 19B. Thus, holes 140 communicating with the conductor portions 121 are formed in the wafer 120a.

Figure 20A:
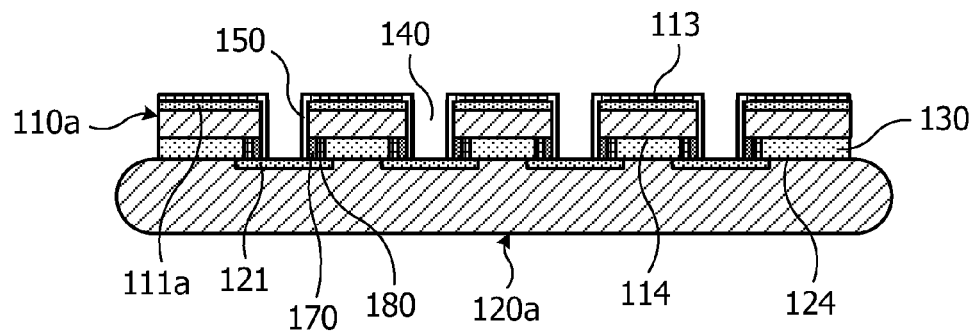
FIGS. 20A to 20C are explanatory views (No. 4) of an example of the stacking process according to the third embodiment.
Figure 20B:
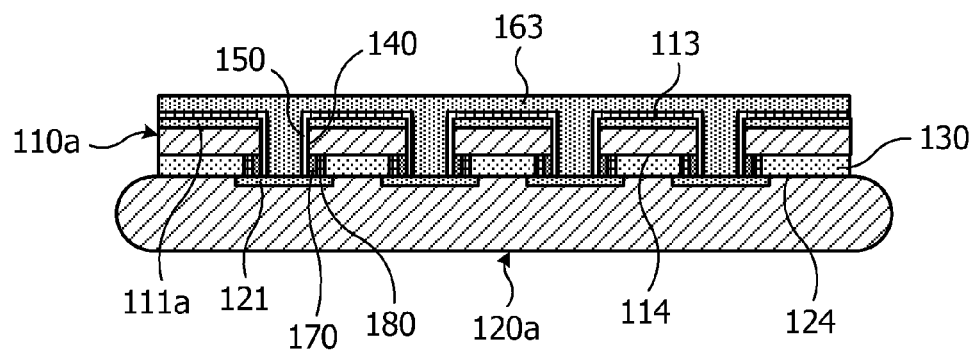
Figure 20C:
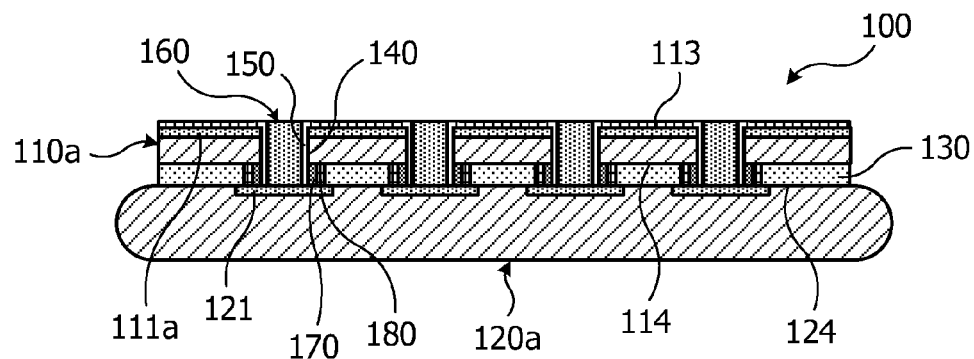

FIG. 20A is a schematic cross-sectional view of a principal portion of an example of a film formation process according to the third embodiment. FIG. 20B is a schematic cross-sectional view of a principal portion of an example of a plating process according to the third embodiment. FIG. 20C is a schematic cross-sectional view of a principal portion of an example of a grinding process according to the third embodiment.

After the formation of the hole 140, the film 180 having viscoelasticity, the film 170 having a predetermined thermal expansion coefficient, and the barrier film 150 are formed according to the examples described with reference to FIG. 12A to FIG. 14B above to obtain a state illustrated in FIG. 20A.

Then, a barrier metal layer and a seed layer (which are not illustrated herein for convenience) are formed, and then a conductor layer 163 is formed by an electrolytic plating method as illustrated in FIG. 20B according to the example described with reference to FIGS. 15A to 15C above.

Then, CMP is performed to remove part of the conductor layer 163, the seed layer, and the barrier metal layer by grinding to thereby obtain a state where conductor vias 160 are formed as illustrated in FIG. 20C.

By the method illustrated in FIG. 17A to FIG. 20C, the electronic device 100 having a bumpless wafer-on-wafer form is obtained. When the electronic device 100 thus obtained is individualized by dicing, the electronic device 100 having a bumpless chip-on-chip form may be obtained.

By the use of the electronic device forming method according to the third embodiment, the electronic device 100 in which the film 170 having a predetermined thermal expansion coefficient, the film 180 having viscoelasticity, and the resin layer 130 are disposed in this order from the inside around the conductor via 160, the side wall of which is covered with the barrier film 150, is obtained. Due to the fact that the predetermined film 170 and the predetermined film 180 are disposed between the barrier film 150 and the resin layer 130 covering the conductor via 160, a reduction in the barrier property of the barrier film 150 is suppressed even when the heating process including heating and subsequent cooling is repeated to the electronic device 100. Thus, diffusion of the components of the conductor via 160 and a short circuit of the circuit in the substrate 110, deterioration of the characteristics of elements, such as a transistor, an increase in the resistance of the conductor via 160, and the like caused by the diffusion of the components are suppressed, so that the electronic device 100 with high characteristics and high reliability is realized.

Fourth Embodiment

Herein, another example of the electronic device forming method is described as the fourth embodiment.

FIG. 21A to FIG. 23B are explanatory views of an example of an electronic device forming method according to the fourth embodiment. Hereinafter, each process of the electronic device forming method according to the fourth embodiment is described in order.

Figure 21A:
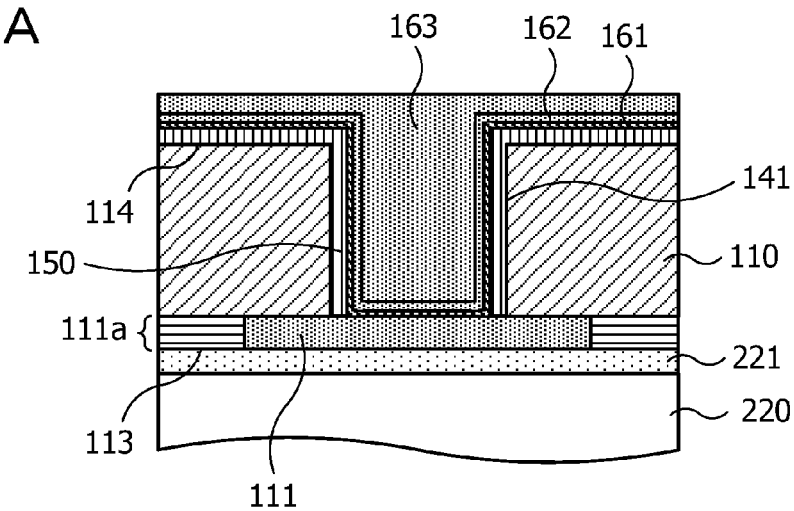
FIGS. 21A to 21C are explanatory views (No. 1) of an example of an electronic device forming method according to a fourth embodiment.
Figure 21B:
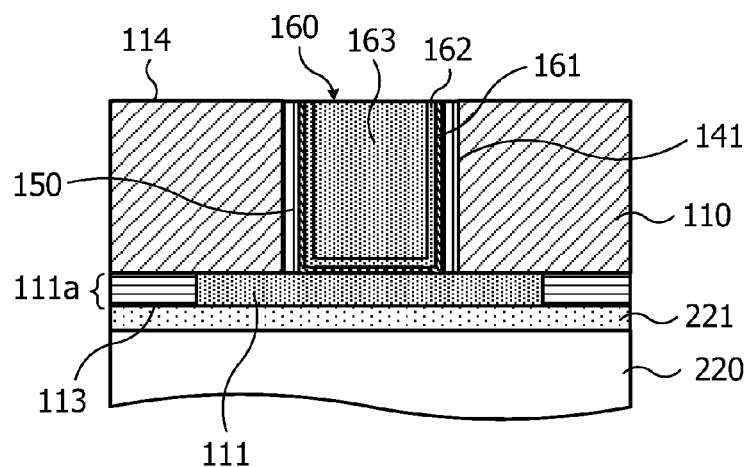
Figure 21C:
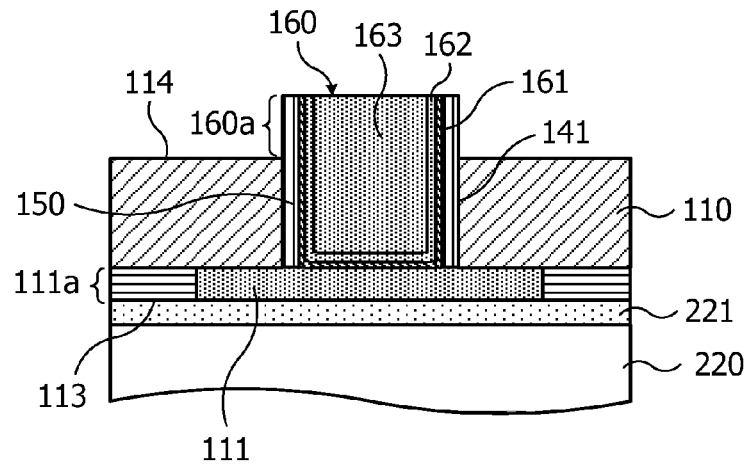

FIG. 21A is a schematic cross-sectional view of a principal portion of an example of a conductor layer formation process according to the fourth embodiment. FIG. 21B is a schematic cross-sectional view of a principal portion of an example of a first grinding process according to the fourth embodiment. FIG. 21C is a schematic cross-sectional view of a principal portion of an example of an etching process according to the fourth embodiment.

First, as illustrated in FIG. 21A, a substrate 110 having a circuit layer 111a on which a predetermined circuit containing a transistor, wiring, and the like is formed is prepared, and then the substrate 110 is bonded to a support 220 through an adhesive 221 with a circuit surface 113 facing the support 220. A substrate surface 114 opposite to the circuit surface 113 of the bonded substrate 110 is ground by grinding processing to be thinned up to 50 µm, for example.

Subsequently, using a photolithography technique and etching technique, a hole 141 which penetrates the substrate 110 and communicates with a conductor portion 111 in the circuit layer 111a is formed. Then, a barrier film 150 covering the inner wall of the hole 141 is formed in such a manner that the conductor portion 111 is exposed, a barrier metal layer 161 and a seed layer 162 are formed, and then a conductor layer 163 is formed by an electrolytic plating method. Thus, the state illustrated in FIG. 21A is obtained.

After the processes up to the formation of the conductor layer 163 are completed, CMP is performed to remove part of the conductor layer 163, the seed layer 162, and the barrier metal layer 161 by grinding. Thus, a state where a conductor via 160 is formed as illustrated in FIG. 21B is obtained.

By the electronic device forming method according to the fourth embodiment, the conductor via 160 is formed from the substrate surface 114 (back surface) of the thinned substrate 110 as described above.

After the formation of the conductor via 160, the substrate surface 114 opposite to the support 220 of the substrate 110 is etched to protrude an upper portion 160a of the conductor via 160 as illustrated in FIG. 21C. The etching may be performed by wet etching. For example, when Si is used for the substrate 110 and the Si is exposed to the substrate surface 114, wet etching using fluoric acid and nitric acid and subsequent wet processing using tetramethyl ammonium hydrooxide (TMAH) are performed to protrude the upper portion 160a of the conductor via 160. The height from the substrate surface 114 of the upper portion 160a of the conductor via 160 may be set to 5 µm, for example.

Figure 22A:
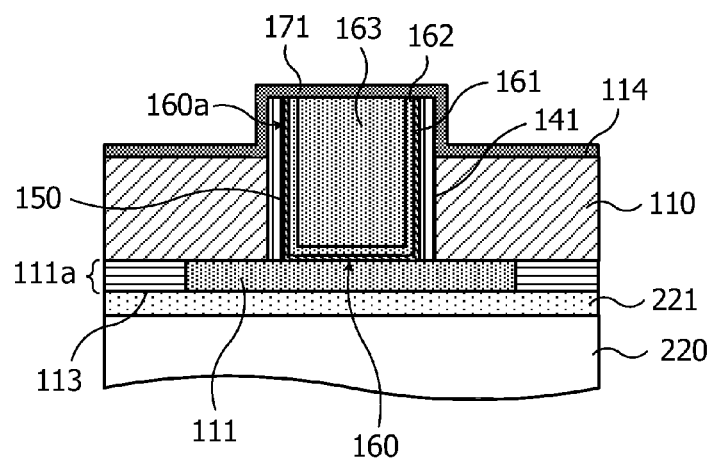
FIGS. 22A to 22C are explanatory views (No. 2) of an example of the electronic device forming method according to the fourth embodiment.
Figure 22B:
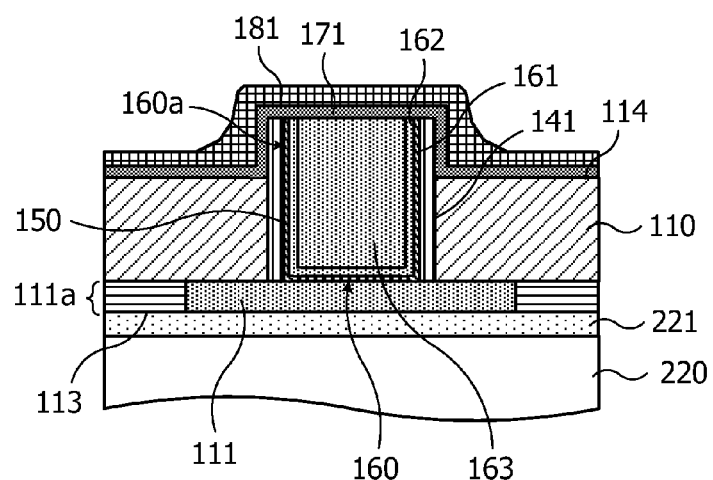
Figure 22C:
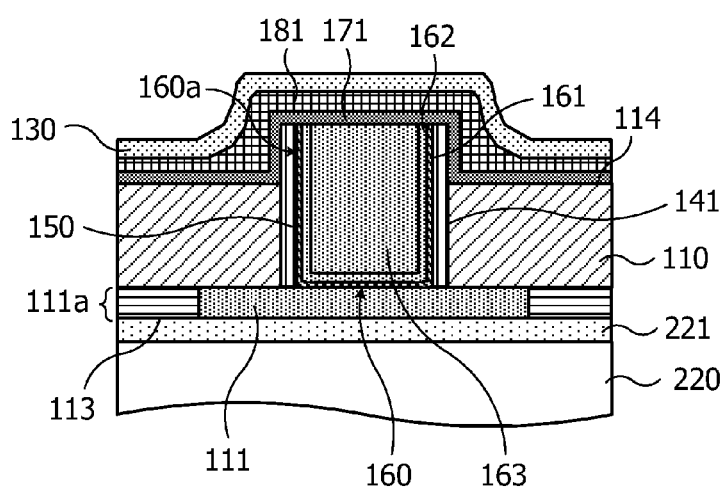

FIG. 22A is a schematic cross-sectional view of a principal portion of an example of a first material formation process according to the fourth embodiment. FIG. 22B is a schematic cross-sectional view of a principal portion of an example of a second material formation process according to the fourth embodiment. FIG. 22C is a schematic cross-sectional view of a principal portion of an example of a resin layer formation process according to the fourth embodiment.

After protruding the upper portion 160a of the conductor via 160, a material 171 is first formed on the substrate surface 114 from which the upper portion 160a of the conductor via 160 of the substrate 110 is projected as illustrated in FIG. 22A. As the material 171, a material of a film having a thermal expansion coefficient between the thermal expansion coefficients of the conductor via 160 and a resin layer 130 described later is formed. For example, a TEOS film is deposited as the material 171 using a CVD method in the same manner as in the third embodiment.

Subsequently, a material 181 of a film having viscoelasticity is formed on the material 171 as illustrated in FIG. 22B. For example, a fluororubber coating which is a latex material is spray-applied in the same manner as in the third embodiment, and then cured at 120° C. to thereby form the material 181.

On the material 181, the resin layer 130 is further formed as illustrated in FIG. 22C. For the resin layer 130, organic materials, such as BCB, may be used.

Figure 23A:
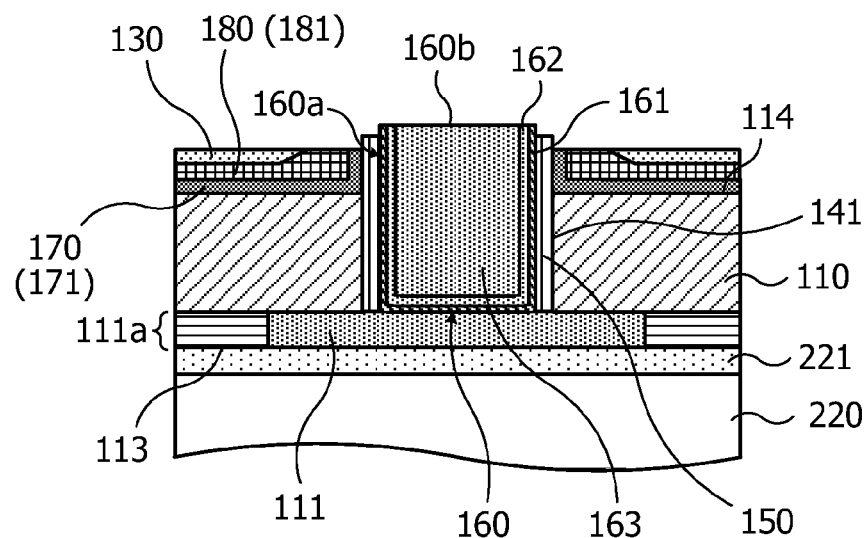
FIGS. 23A and 23B are explanatory views (No. 3) of an example of the electronic device forming method according to the fourth embodiment.
Figure 23B:
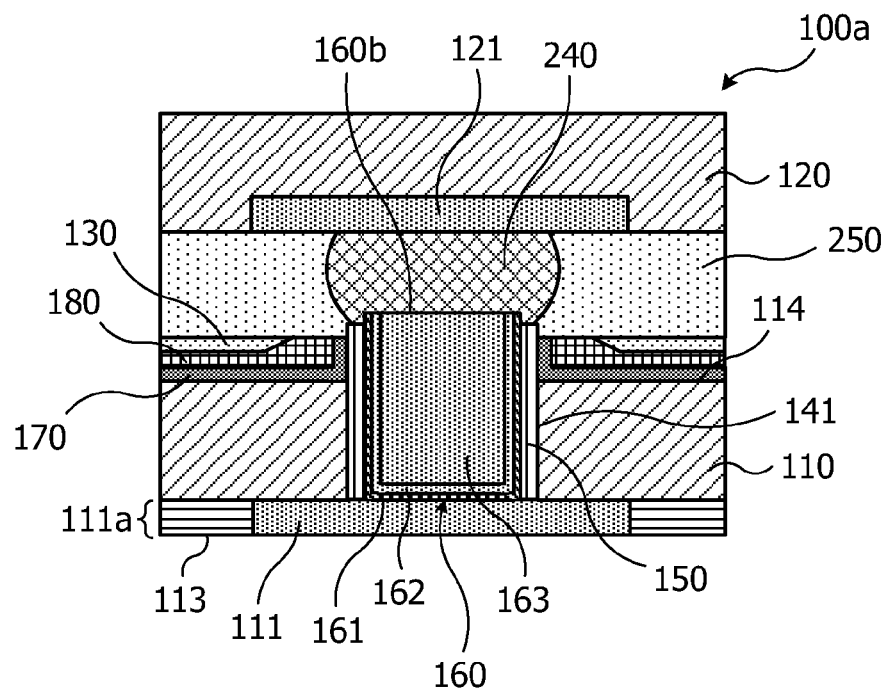

FIG. 23A is a schematic cross-sectional view of a principal portion of an example of a second grinding process according to the fourth embodiment. FIG. 23B is a schematic cross-sectional view of a principal portion of an example of a substrate stacking process.

After the formation of the predetermined material 171, the predetermined material 181, and the predetermined resin layer 130 on the substrate surface 114 from which the upper portion 160a of the conductor via 160 is protruded as described above, the materials 171 and 181 and the resin layer 130 are ground to be exposed to at least an upper end surface 160b of the conductor via 160 as illustrated in FIG. 23A. Thus, a structure in which the film 170 (material 171) having a predetermined thermal expansion coefficient, the film 180 (material 181) having viscoelasticity, and the resin layer 130 are disposed in this order from the inside around the conductor via 160, the side wall of which is covered with the barrier film 150, is obtained.

After such a structure is obtained by grinding, the support 220 and the adhesive 221 are removed, for example, and then the substrate 110 and a substrate 120 are bonded to each other as illustrated in FIG. 23B. For the substrate 120, one on which a predetermined circuit (herein, only a conductor portion 121 is illustrated) containing a transistor, wiring, and the like is formed is used. The conductor via 160, an upper end surface 160b of which is exposed, of the substrate 110 and the conductor portion 121 of the substrate 120 are bonded to each other using a bump 240, such as solder. After the substrate 110 and the substrate 120 are bonded to each other, a space between the substrate 110 and the substrate 120 is filled with an underfill material to thereby form a resin layer 250.

By the method as illustrated in FIG. 21A to FIG. 23B, an electronic device 100a in which the substrate 110 and the substrate 120 which are stacked are electrically connected to each other through the conductor via 160 and the bump 240 is obtained.

In the electronic device 100a, the film 170 having a predetermined thermal expansion coefficient, the film 180 having viscoelasticity, and the resin layer 130 are disposed in this order from the inside around the conductor via 160, the side wall of which is covered with the barrier film 150. Due to the fact that the predetermined film 170 and the predetermined film 180 are disposed between the barrier film 150 and the resin layer 130 covering the conductor via 160, a reduction in the barrier property of the barrier film 150 is suppressed even when the heating process including heating and subsequent cooling is repeated to the electronic device 100a. Thus, diffusion of the components of the conductor via 160 and a short circuit of the circuit in the substrate 110, deterioration of the characteristics of elements, such as a transistor, an increase in the resistance of the conductor via 160, and the like caused by the diffusion of the components, are suppressed, and thus the electronic device 100a with high characteristics and high reliability is realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising;
a first substrate;
a second substrate Located facing the first substrate;
a resin layer formed between the first substrate and the second substrate and having a first thermal expansion coefficient;
a conductor via penetrating the first substrate and the resin layer;
a barrier film covering a side surface of the conductor via;
a first film formed between the resin layer and the barrier film and having viscoelasticity; and
a second film formed between the first film and the barrier film and having a second thermal expansion coefficient lower than the first thermal expansion coefficient.

2. The electronic device according to claim 1, wherein the first film is a rubber elastic body.

3. The electronic device according to claim 1, wherein the firstfilm has an elastic modulus which varies in a range of 0.01 GPa to 0.1 GPa.

4. The electronic device according to claim 1, wherein the firstfilm has a glass transition point lowerthan a temperature applied in manufacturing and use of the electronic device.

5. The electronic device according to claim 1, wherein the second thermal expansion coefficient of the secondfilm is higher than a third thermal expansion coefficient of the conductor via.

6. The electronic device according to claim 1, wherein the secondfilm has an elastic modulus of 3 GPa or more.

7. The electronic device according to claim 1, wherein the secondfilm has a glass transition point equal to or higher than a temperature applied in manufacturing and use of the electronic device.

8. The electronic device according to claim 1, wherein the secondfilm does not have a glass transition point.

9. The electronic device according to claim 1, wherein the firstfilm is interposed between a first end portion on a side of the first substrate of the secondfilm and the first substrate and between a second end portion on a side of the second substrate of the secondfilm and the second substrate.

10. A method for manufacturing an electronic device comprising:
stacking a first substrate and a second substrate with a resin layer having a first thermal expansion coefficient interposed between the first substrate and the second substrate;
forming a first hole penetrating the first substrate;
forming a second hole communicating with the first hole and having an opening diameter wider than an opening diameter of the first hole in the resin layer;
forming a first film having viscoelasticity on an inner wall of the second hole;
forming a second film having a second thermal expansion coefficient lower than the first thermal expansion coefficient on an inner wall of the first film;
forming a barrier film on an inner wall of the second film and onan inner wall of the first hole; and
forming a conductor via in the first hole and the second hole after the formation of the barrier film.

11. A method for manufacturing an electronic device comprising:
protruding an end portion of a conductor via and an end portion of a barrier film covering a side surface of the conductor via on a first surface side of a first substrate;
covering the end portion of the conductor via and the end portion of the barrier film protrudingfrom the first surface with a secondfilm having a second thermal expansion coefficient;
covering the secondfilm with a firstfilm having viscoelasticity;
forming a resin layer having a first thermal expansion coefficient higher than the second thermal expansion coefficient on the first substrate;
exposing the end surface of the conductorvia from the resin layer, the first film, and the second filmby removing part of the resin layer, the first film, and the second film; and
connecting a second substrate to the first surface of the first substrate.

* * * * *